(12) United States Patent
Lee et al.

(10) Patent No.: US 11,889,742 B2
(45) Date of Patent: Jan. 30, 2024

(54) APPARATUS OF MANUFACTURING DISPLAY DEVICE AND METHOD OF MANUFACTURING DISPLAY DEVICE

(71) Applicant: Samsung Display Co., Ltd., Yongin-si (KR)

(72) Inventors: Seungkuk Lee, Asan-si (KR); Beomjun Cheon, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 294 days.

(21) Appl. No.: 17/449,559

(22) Filed: Sep. 30, 2021

(65) Prior Publication Data

US 2022/0140295 A1    May 5, 2022

(30) Foreign Application Priority Data

Nov. 4, 2020   (KR) .................. 10-2020-0145780
Feb. 5, 2021   (KR) .................. 10-2021-0016874

(51) Int. Cl.
*H10K 71/00*   (2023.01)
*H10K 71/80*   (2023.01)
*H01L 21/67*   (2006.01)

(52) U.S. Cl.
CPC ........ *H10K 71/00* (2023.02); *H01L 21/67011* (2013.01); *H01L 21/67132* (2013.01);
(Continued)

(58) Field of Classification Search
CPC ................ Y10T 156/19; Y10T 156/11; Y10T 156/1983; Y10T 156/1168; Y10T 156/1179; Y10T 156/1195; Y10T 156/12; Y10T 156/13; Y10T 156/125; Y10T 156/1322; Y10T 156/195; Y10T 156/1956;
(Continued)

(56) References Cited

U.S. PATENT DOCUMENTS 5,676,789 A    10/1997  Hamamura
5,938,890 A *   8/1999  Schlinkmann ........ B65C 9/1884
                                               221/73

(Continued)

FOREIGN PATENT DOCUMENTS

JP           2642317 B2    8/1997
KR       10-2006876 B1    8/2019
(Continued)

*Primary Examiner* — Sophia T Nguyen
(74) *Attorney, Agent, or Firm* — Lewis Roca Rothgerber Christie LLP

(57) ABSTRACT

A manufacturing apparatus of a display device includes: a first stage including a plurality of cell units, each including: a display unit including a display area, and a pad area; and a protective film unit attached to the display unit, and including a display film portion corresponding to the display area, and a pad film portion corresponding to the pad area; a second stage; and a transfer unit to transfer the cell units to the second stage from the first stage, and to peel off the pad film portion. The transfer unit includes: a body member; a plurality of pins along a first direction on a first surface of the body member; a plurality of suction pads on the first surface of the body member along a second direction; and a reel member on a second surface of the body member to supply a peeling tape to the second surface.

20 Claims, 19 Drawing Sheets

(52) U.S. Cl.
CPC ............ *H10K 71/80* (2023.02); *H10K 71/851* (2023.02); *Y10T 156/11* (2015.01); *Y10T 156/1174* (2015.01); *Y10T 156/1179* (2015.01)

(58) Field of Classification Search
CPC ......... Y10T 156/1994; H01L 21/67092; H01L 21/67121; H01L 21/67132; H01L 21/67011; H01L 21/6838; H01L 21/687; H01L 21/68714; H01L 21/7806; H01L 21/782; H01L 21/78; H01L 2221/68386; H01L 2221/68395; B32B 38/10; B32B 43/006; B32B 2457/20; B32B 2457/206; B32B 38/1858; B32B 38/18; B32B 38/1825; H10K 71/00; H10K 71/851; H10K 71/50
See application file for complete search history.

(56) References Cited

U.S. PATENT DOCUMENTS

| | | | | | |
|---|---|---|---|---|---|
| 6,030,485 | A * | 2/2000 | Yamada | ............... | B29C 63/0013 156/154 |
| 6,204,092 | B1 * | 3/2001 | Freund | ............... | H01L 21/67132 438/464 |
| 6,238,515 | B1 * | 5/2001 | Tsujimoto | ............... | H01L 21/68 438/464 |
| 6,347,655 | B1 * | 2/2002 | Yamamoto | ............... | H01L 24/75 156/583.1 |
| 6,569,282 | B1 * | 5/2003 | Arisa | ............... | H01L 21/67207 156/345.31 |
| 6,803,320 | B2 * | 10/2004 | Yamamoto | ............ | H01L 21/6836 438/33 |
| 7,172,673 | B2 * | 2/2007 | Kurosawa | ............ | H01L 21/67132 438/464 |
| 7,611,600 | B2 * | 11/2009 | Tsujimoto | ........... | H01L 21/67132 156/308.2 |
| 8,171,977 | B2 * | 5/2012 | Kobayashi | ........ | H01L 21/67132 156/760 |
| 8,426,293 | B2 * | 4/2013 | Tsurume | ............ | H01L 27/1255 438/464 |
| 8,470,130 | B2 * | 6/2013 | Chong | ............... | H01L 21/67132 156/707 |
| 8,499,813 | B2 * | 8/2013 | Chien | ............... | H01L 21/67132 156/707 |
| 8,789,569 | B2 * | 7/2014 | Noda | ................. | H01L 21/2007 156/286 |
| 8,885,138 | B2 * | 11/2014 | Tannas, Jr. | ................. | H01J 9/50 349/190 |
| 8,991,463 | B2 * | 3/2015 | Jeong | ................. | B29C 63/0013 156/763 |
| 9,576,854 | B2 * | 2/2017 | Itou | ................. | H01L 21/67253 |
| 9,640,718 | B2 * | 5/2017 | Miura | ..................... | H10K 71/80 |
| 10,062,588 | B2 * | 8/2018 | Huska | ............. | H01L 21/67132 |
| 10,340,173 | B2 * | 7/2019 | Hooper | ............ | H01L 21/67132 |
| 10,608,209 | B2 * | 3/2020 | Cheon | ..................... | H10K 71/00 |
| 10,625,443 | B2 * | 4/2020 | Tanaka | ................. | B65H 29/56 |
| 10,993,358 | B1 * | 4/2021 | Chen | ........................ | H05K 3/00 |
| 11,161,335 | B2 * | 11/2021 | Jung | ..................... | G06F 1/1609 |
| 11,505,457 | B2 * | 11/2022 | Shen | ................... | B81C 99/0025 |
| 2002/0094760 | A1 * | 7/2002 | Lim | ........................ | B24B 37/34 451/41 |
| 2003/0000075 | A1 * | 1/2003 | Ogimoto | ........... | H01L 21/68778 29/729 |
| 2003/0098131 | A1 * | 5/2003 | Hayasaka | ............ | B65C 9/1884 156/763 |
| 2004/0115904 | A1 * | 6/2004 | Cheung | ........... | H01L 21/67092 438/464 |
| 2005/0015970 | A1 * | 1/2005 | Arneson | ............. | G06K 19/077 29/601 |
| 2005/0205204 | A1 * | 9/2005 | Kurosawa | ......... | H01L 21/67132 156/716 |
| 2005/0255675 | A1 * | 11/2005 | Farnworth | ........ | H01L 21/67092 438/460 |
| 2006/0191633 | A1 * | 8/2006 | Hayasaka | ........... | B29C 63/0013 156/247 |
| 2007/0074822 | A1 * | 4/2007 | Akechi | ............... | H01L 21/6835 156/941 |
| 2007/0284038 | A1 * | 12/2007 | Yamamoto | ........ | H01L 21/67132 156/391 |
| 2008/0113486 | A1 * | 5/2008 | Eguchi | ................ | H01L 21/6835 438/735 |
| 2009/0014124 | A1 * | 1/2009 | Tsujimoto | ......... | H01L 21/67132 156/759 |
| 2009/0065144 | A1 * | 3/2009 | Yamamoto | ........ | H01L 21/67132 156/763 |
| 2009/0242124 | A1 * | 10/2009 | Konno | ............. | H01L 21/67011 156/716 |
| 2011/0088845 | A1 * | 4/2011 | Chong | ............. | H01L 21/67132 156/761 |
| 2011/0155314 | A1 * | 6/2011 | Kobayashi | ........ | H01L 21/67132 156/349 |
| 2011/0192547 | A1 * | 8/2011 | Yip | ..................... | H01L 21/6838 156/758 |
| 2012/0103501 | A1 * | 5/2012 | Neeper | ............... | B29C 63/0013 156/64 |
| 2013/0039733 | A1 * | 2/2013 | Webb | ................ | H01L 21/67132 414/800 |
| 2014/0076500 | A1 * | 3/2014 | Honda | ................... | B32B 43/006 156/750 |
| 2014/0120639 | A1 * | 5/2014 | Park | ....................... | H10K 71/80 438/22 |
| 2014/0332166 | A1 * | 11/2014 | Honda | ................. | H01L 21/6838 156/708 |
| 2015/0059986 | A1 * | 3/2015 | Komatsu | ............... | C03B 33/027 83/872 |
| 2015/0367622 | A1 * | 12/2015 | Adachi | ................ | B32B 37/187 156/759 |
| 2016/0276195 | A1 * | 9/2016 | Huska | ...................... | H01L 24/89 |
| 2017/0140959 | A1 * | 5/2017 | Huska | ............... | H01L 21/67265 |
| 2018/0122672 | A1 * | 5/2018 | Chang | ................. | H01L 21/6776 |
| 2018/0147825 | A1 * | 5/2018 | Tsao | .................... | H01L 21/67092 |
| 2018/0204749 | A1 * | 7/2018 | Huska | ............... | H01L 21/67265 |
| 2018/0269086 | A1 * | 9/2018 | Huska | ............... | H01L 21/67778 |
| 2019/0088909 | A1 * | 3/2019 | Cheon | .................. | H10K 59/131 |
| 2019/0111612 | A1 * | 4/2019 | Han | ....................... | B32B 43/006 |
| 2019/0157100 | A1 * | 5/2019 | Harikai | ............. | H01L 21/02118 |
| 2019/0295894 | A1 * | 9/2019 | Okita | ..................... | H01L 21/268 |
| 2019/0334130 | A1 * | 10/2019 | Cho | ........................ | H10K 50/868 |
| 2019/0371668 | A1 * | 12/2019 | Karasaki | ............ | H01L 23/544 |
| 2020/0023630 | A1 * | 1/2020 | Sigl | ..................... | H01L 21/67132 |
| 2020/0105551 | A1 * | 4/2020 | Wendt | ..................... | H01L 24/97 |
| 2020/0144120 | A1 * | 5/2020 | Suzuki | ................. | H01L 21/304 |
| 2020/0168848 | A1 | 5/2020 | Jung et al. | | |
| 2020/0168849 | A1 * | 5/2020 | Jung | ..................... | H10K 59/12 |
| 2021/0039304 | A1 * | 2/2021 | Han | ....................... | B29C 63/0013 |
| 2021/0249290 | A1 * | 8/2021 | Sen | ....................... | H01L 21/681 |
| 2021/0347159 | A1 * | 11/2021 | Ju | ............................ | B32B 37/182 |
| 2021/0376188 | A1 * | 12/2021 | You | ....................... | H01L 33/0095 |
| 2022/0140295 | A1 * | 5/2022 | Lee | ...................... | H01L 21/6835 438/33 |
| 2022/0320466 | A1 * | 10/2022 | Chen | ..................... | H10K 71/80 |
| 2023/0032393 | A1 * | 2/2023 | Kwon | ................... | H10K 59/40 |

FOREIGN PATENT DOCUMENTS

| | | |
|---|---|---|
| KR | 10-2057921 B1 | 12/2019 |
| KR | 10-2020-0060654 A | 6/2020 |
| KR | 10-2020-0060655 A | 6/2020 |

* cited by examiner

APPARATUS OF MANUFACTURING DISPLAY DEVICE AND METHOD OF MANUFACTURING DISPLAY DEVICE

CROSS-REFERENCE TO RELATED APPLICATIONS

This application claims priority to and the benefit of Korean Patent Application No. 10-2020-0145780, filed on Nov. 4, 2020, and Korean Patent Application No. 10-2021-0016874, filed on Feb. 5, 2021, the entire content of each of which is incorporated by reference herein.

BACKGROUND

1. Field

Aspects of one or more embodiments of the present disclosure relate to an apparatus for manufacturing a display device, and a method of manufacturing the display device. More particularly, aspects of one or more embodiments of the present disclosure relate to a manufacturing apparatus for manufacturing a display device, which may be used to remove a protective film, and a method of manufacturing the display device using the manufacturing apparatus.

2. Description of the Related Art

In recent years, various suitable types of panels are used in the field of manufacturing display devices, for example, such as a liquid crystal display (LCD), an organic light emitting diode (OLED), and a touch screen panel (TSP).

The manufacturing process for the display device is performed while the display device is moved through various process spaces. A protective film is attached on a surface of the display device to prevent the surface of the display device from being contaminated or damaged while moving through the various process spaces, and the protective film may be removed in the process of connecting internal wirings or pads. Accordingly, an apparatus that may be used to remove the protective film that is attached on a panel surface may be desired.

The above information disclosed in this Background section is for enhancement of understanding of the background of the present disclosure, and therefore, it may contain information that does not constitute prior art.

SUMMARY

During the process of separating the protective film that is adhered to a pad area of the display device, it may take a lot of time to separate the protective film in a unit of a cell according to a comparative method, and defects may occur due to errors in seating the cell and variations in the width of a pad part.

One or more embodiments of the present disclosure are directed to an apparatus for manufacturing a display device to reduce a process time.

One or more embodiments of the present disclosure are directed to a method of manufacturing the display device.

According to one or more embodiments of the present disclosure, an apparatus for manufacturing a display device, includes: a first stage including a plurality of cell units defined by dividing a mother substrate and a work protective film attached on the mother substrate, each of the cell units including: a display unit including a display area, and a pad area; and a protective film unit attached to the display unit, and including a display film portion corresponding to the display area, and a pad film portion corresponding to the pad area; a second stage where the pad film portion of the cell units is peeled off; and a transfer unit configured to transfer the cell units to the second stage from the first stage, and to peel off the pad film portion, the transfer unit including: a body member including a first surface and a second surface opposite to the first surface; a plurality of pins along a first direction on the first surface of the body member; a plurality of suction pads on the first surface of the body member along a second direction crossing the first direction; and a reel member on the second surface of the body member, and configured to supply a peeling tape to the second surface of the body member.

In an embodiment, the pins may be located along a plurality of lines defined in the first direction, and may be spaced from each other.

In an embodiment, each of the cell units may correspond to at least one of the pins.

In an embodiment, the reel member may include a plurality of reel members, and the plurality of reel members may be located along the second direction, and may be spaced from each other.

In an embodiment, each of the plurality of reel members may include: a first reel configured to supply the peeling tape; and a second reel facing the first reel, and configured to take up the peeling tape.

In an embodiment, the suction pads may be configured to adsorb the display film portion.

In an embodiment, at least two suction pads from among the plurality of suction pads may be configured to adsorb one cell unit from among the plurality of cell units.

In an embodiment, each of the suction pads may include: a suction portion configured to adsorb a corresponding cell unit from among the plurality of cell units; a buffer portion connected to the suction portion; and a connection portion connecting the suction portion and the body member to each other. The suction portion and the buffer portion may include a rubber material.

In an embodiment, the suction portion may have a vacuum suction force.

In an embodiment, each of the pins may include: a contact portion in contact with the peeling tape; a support portion extending from the contact portion, and located in a hole defined through the body member; and a spring in contact with the contact portion, and located in the support portion.

In an embodiment, the pins may be configured to concurrently descend or ascend vertically.

In an embodiment, the apparatus may further include a driver configured to drive the transfer unit.

In an embodiment, the second stage may include a fixing member configured to fix the cell units.

According to one or more embodiments of the present disclosure, a method of manufacturing a display device, includes: providing a work substrate on a first stage, the work substrate including: a mother substrate including a plurality of display units, each of the display units including a display area, and a pad area; and a work protective film attached to the mother substrate, and including a display film portion corresponding to the display area, and a pad film portion corresponding to the pad area; cutting the work substrate to divide the work substrate into a plurality of cell units, each of the cell units including one display unit from among the plurality of display units, and a protective film unit of the work protective film, the protective film unit corresponding to the one display unit; transferring the cell units to a second stage using a transfer unit, the transfer unit including: a body member; a plurality of pins along a first direction on a first surface of the body member; and a plurality of suction pads on the first surface of the body member along a second direction crossing the first direction; attaching a peeling tape to the pad film portion of the cell units by descending the pins vertically; and peeling off the pad film portion of the cell units attached to the peeling tape by ascending the transfer unit or the pins.

In an embodiment, the transferring of the cell units to the second stage may include: adsorbing the display film portion of the cell units by the suction pads; and separating the cell units from the suction pads on the second stage, and placing the cell units on the second stage.

In an embodiment, the method may further include rotating a plurality of reel members to take up the peeling tape after the peeling off of the pad film portion of the cell units, the plurality of reel members being located at sides of a second surface of the body member opposite to the first surface of the body member.

In an embodiment, each of the reel members may include: a first reel configured to supply the peeling tape; and a second reel facing the first reel, and configured to take up the peeling tape, and the first reel may be rotated in synchronization with the second reel taking up of the peeling tape.

In an embodiment, the cutting of the work substrate may include: cutting the work substrate along a first cutting line corresponding to an edge of each of the display units; and cutting the work protective film along a second cutting line corresponding to a boundary between the display area and the pad area of a corresponding display unit.

In an embodiment, the second stage may include a fixing member to fix the cell units.

In an embodiment, the transferring of the cell units to the second stage and the attaching of the peeling tape to the pad film portion of the cell units may be concurrently performed.

According to one or more embodiments of the present disclosure, in a process of peeling off a protective film that is attached to a pad area of the display device, the protective film may be peeled off according to a peeling-off method that is performed in a unit of a mother substrate, instead of using a comparative peeling-off method that is performed in a unit of a cell. Thus, the process time may be reduced, and defects that may be caused by errors in seating the cells and variations in the widths of the pad portions may be reduced or prevented.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
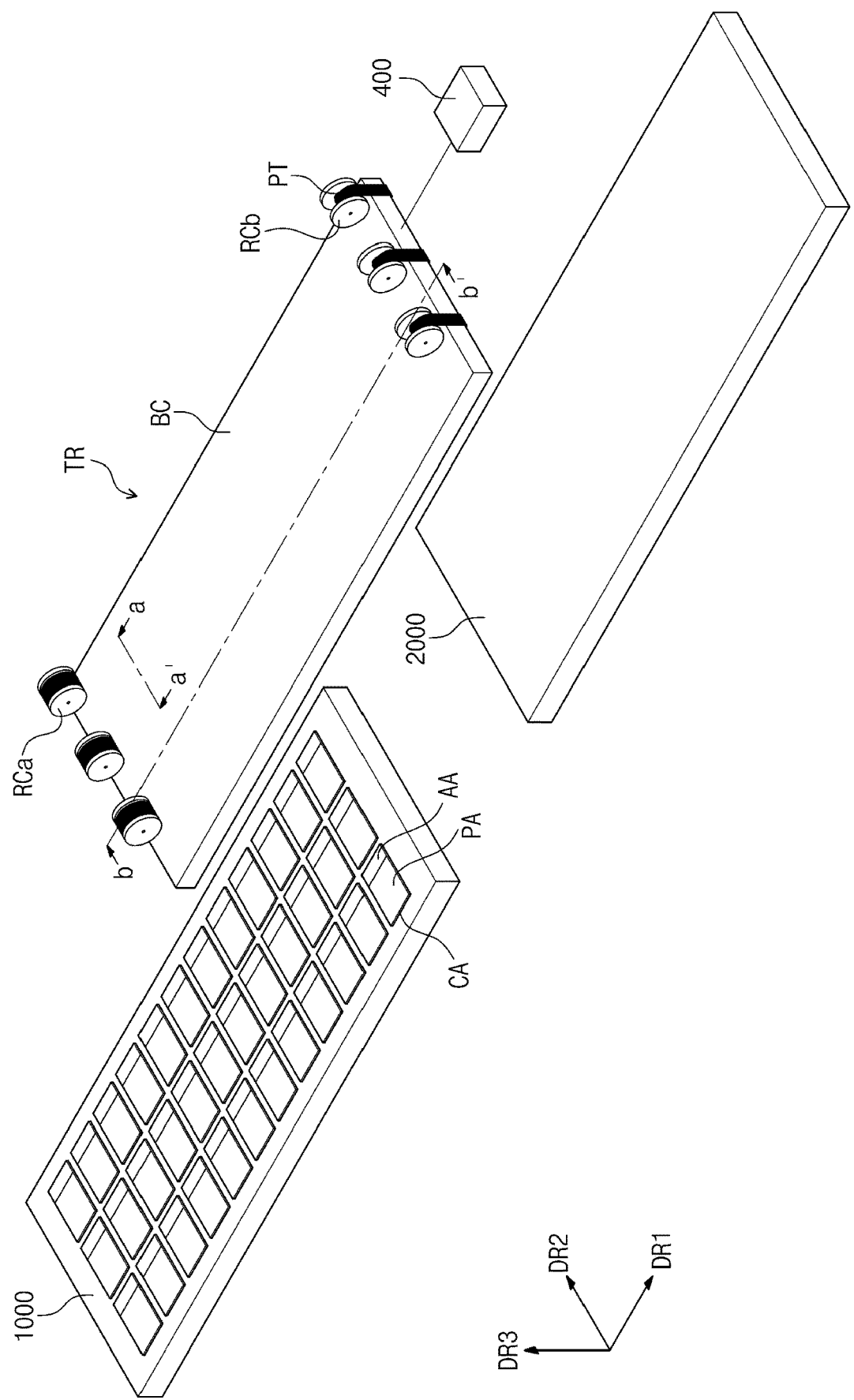
FIG. 1 is a perspective view showing an apparatus of manufacturing a display device according to an embodiment of the present disclosure.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
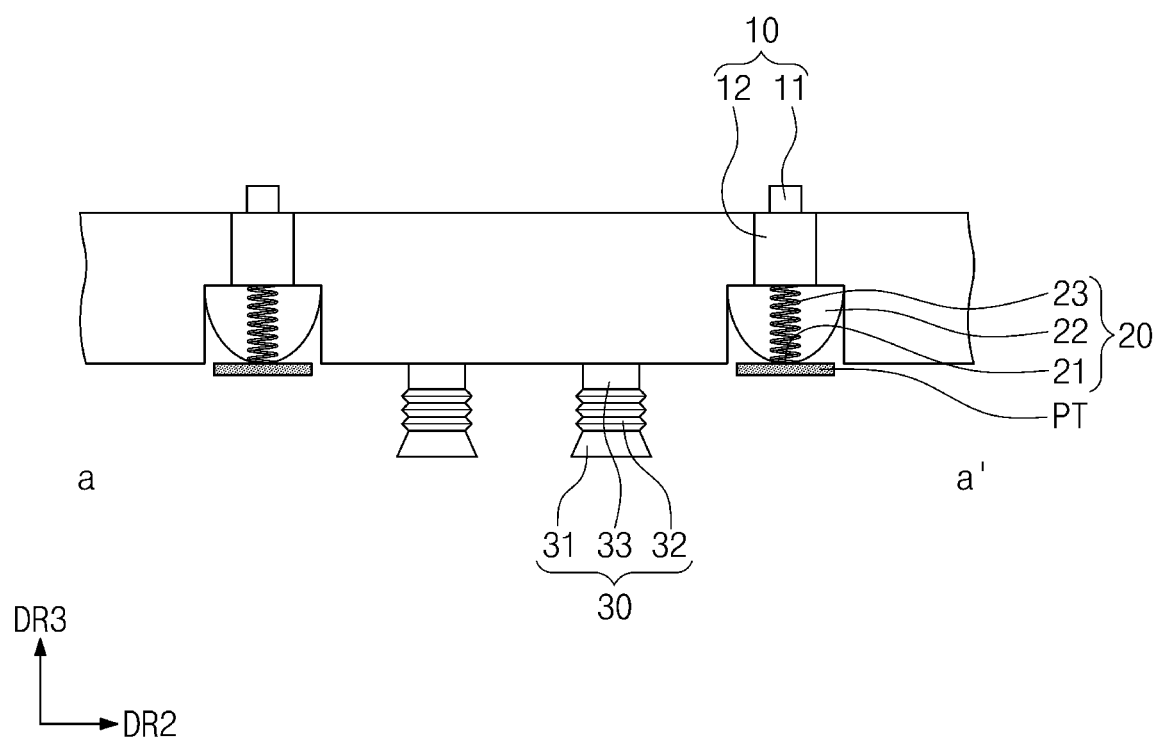
FIG. 2 is a cross-sectional view taken along the line a-a' of FIG. 1, and shows an apparatus of manufacturing a display device according to an embodiment of the present disclosure.
Figure 3:
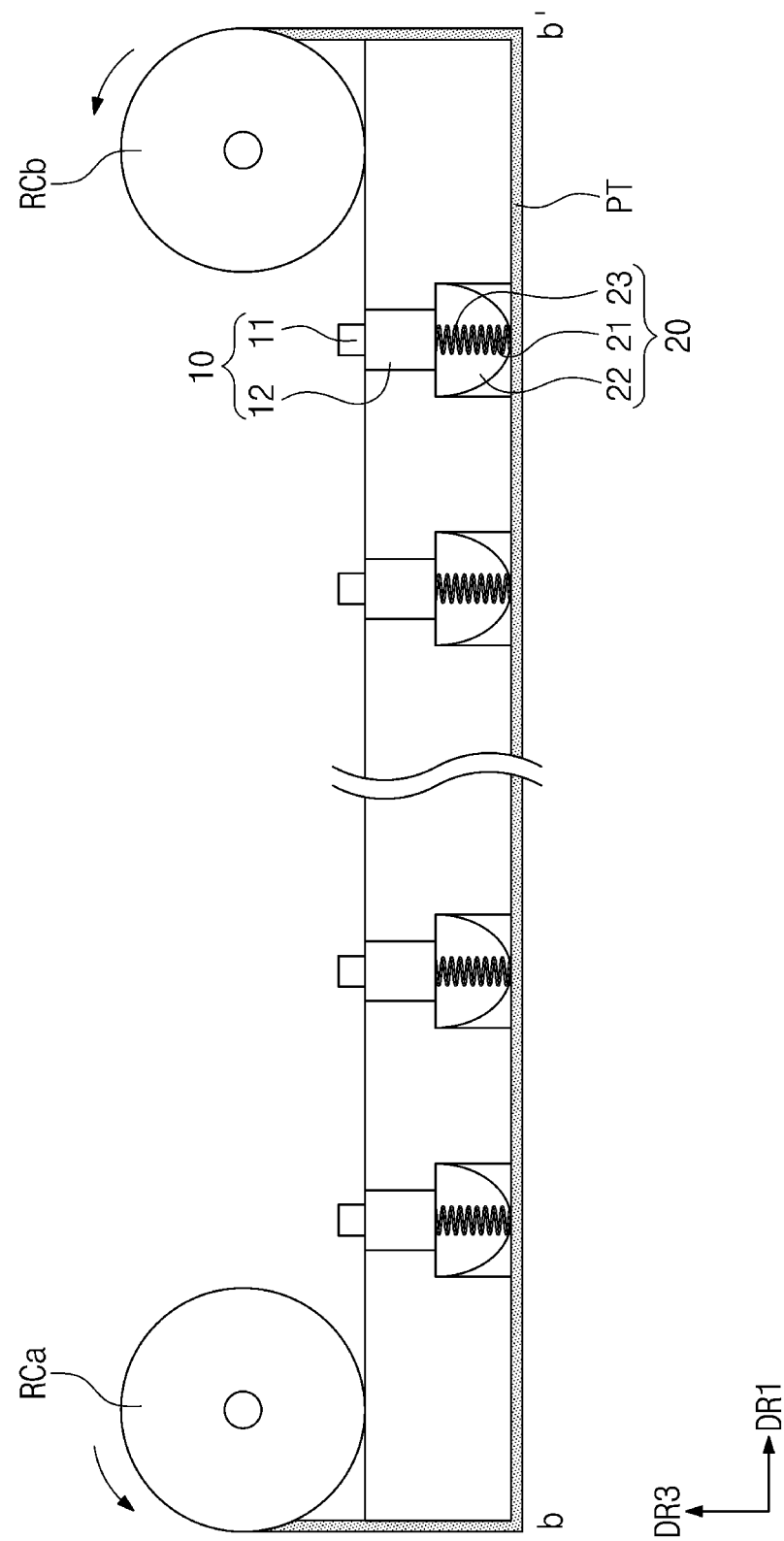
FIG. 3 is a cross-sectional view taken along the line b-b' of FIG. 1, and shows an apparatus of manufacturing a display device according to an embodiment of the present disclosure.

FIG. 1 is a perspective view showing a manufacturing apparatus of a display device according to an embodiment of the present disclosure. FIG. 2 is a cross-sectional view taken along the line a-a' of FIG. 1, and shows the manufacturing apparatus of the display device according to an embodiment of the present disclosure. FIG. 3 is a cross-sectional view taken along the line b-b' of FIG. 1, and shows the manufacturing apparatus of the display device according to an embodiment of the present disclosure.

Referring to FIG. 1, the manufacturing apparatus of the display device includes a first stage 1000, a second stage 2000, and a transfer unit (e.g., a transfer part or a transfer device) TR. In the present embodiment, a connection relation between the transfer unit TR and a driver 400 is schematically shown. The transfer unit TR may be connected to the driver 400 via a cable or a wireless communication module (e.g., a wireless communication device) to transmit and/or receive electrical signals with the driver 400. The driver 400 may be implemented as a general purpose or specific purpose processor, an integrated circuit (IC), an application specific integrated circuit (ASIC), one or more field programmable gate arrays (FPGAs), a group of processing components, or other suitable processing components.

Figure 8:
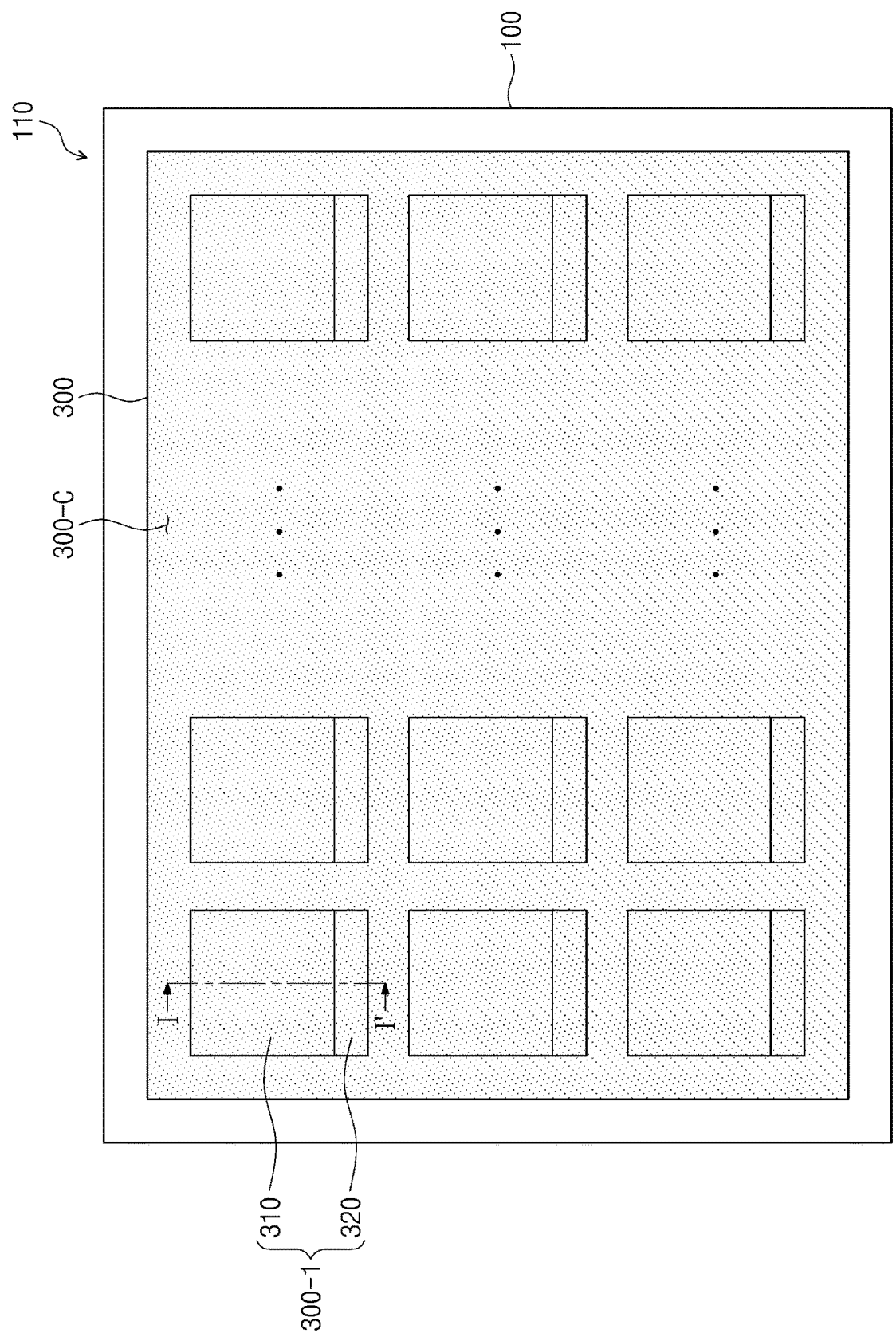
FIG. 8 is a view showing a work substrate including a mother substrate to which a work protective film is attached according to an embodiment of the present disclosure.

Referring to FIGS. 1 and 8, a plurality of cell units (e.g., a plurality of cells or cell areas) CA, each of which includes a pad area PA and a display area AA, may be formed on the first stage 1000 in a plurality of rows and a plurality of columns. The cell units CA may be formed by cutting a work substrate 110 including a mother substrate 100 to which a work protective film 300 is attached. The work substrate 110 may be cut into the cell units CA by a laser process, but the present disclosure is not limited thereto. As another example, the work substrate 110 may be cut by a scribing process.

A pad film portion disposed at (e.g., in or on) the pad area PA of the cell units CA may be peeled off on the second stage 2000. In this case, the transfer unit TR may peel the pad film portion of the cell units CA after transferring, or while transferring, the cell units CA from the first stage 1000 to the second stage 2000.

The second stage 2000 may further include a fixing member to fix the cell units CA. For example, the cell units CA may be fixed by the fixing member that is directly in contact with the cell units CA, or the cell units CA may be fixed by the fixing member that vacuum-suctions the cell units CA. In the case where the second stage 2000 includes the fixing member, the cell units CA may be stably fixed to the second stage 2000 when the pad film portion of the cell units CA is peeled off by the transfer unit TR.

Referring to FIGS. 1 to 3, the transfer unit TR may include a body member BC, a plurality of pins 20, a plurality of suction pads 30, and a reel member RCa and RCb.

The body member BC may have a cuboid structure having a first surface, and a second surface opposite to the first surface.

The pins 20 may be arranged along a line defined on the first surface of the body member BC along a first direction DR1. The suction pads 30 may be arranged on the first surface of the body member BC along a second direction DR2 crossing the first direction DR1.

The pins 20 may be arranged on the first surface of the body member BC along a plurality of lines defined along the first direction DR1, and may be spaced apart from each other.

Each of the pins 20 may include a contact portion 21, a support portion 22, and a spring 23. The contact portion 21 may be disposed at a lowermost position of the pin 20, and makes contact with a peeling tape PT. The support portion 22 may extend from the contact portion 21, and may be inserted into a hole defined through the body member BC. The spring 23, which is an elastic body, may be disposed in the support portion 22.

The pins 20 may have a shape extending in a direction (e.g., a third direction DR3) that is perpendicular to or substantially perpendicular to (e.g., that is vertical or substantially vertical with respect to) the first direction DR1 in which the peeling tape PT travels, and may move up or down in the extending direction (e.g., the vertical direction or the third direction DR3).

A jig 10 may serve as a driving source to move the pins 20 up or down in the vertical direction. For example, the spring 23 may apply an elastic force in a direction away from the body member BC by the driving of the jig 10 to vertically move the pin 20 down.

The jig 10 may include a body portion 12 connected to the spring 23 of the pin 20, and a pressing member 11 disposed on the second surface of the body member BC to be protruded toward the outside and connected to the body portion 12.

The pins 20 may concurrently or substantially concurrently (e.g., simultaneously or substantially simultaneously) move down or move up in the vertical direction, but the present disclosure is not limited thereto. In other words, in some embodiments, the pins 20 may sequentially move down or move up in the vertical direction.

The pins 20 may vertically move down to attach the peeling tape PT to the pad film portion of the cell units CA. Because the pins 20 are disposed on the peeling tape PT, the pad film portion of the cell units CA may be attached to an adhesive surface of the peeling tape PT when the pins 20 are moved down in the vertical direction. In this case, each of the cell units CA may be disposed on the first stage 1000 to correspond to at least one of the pins 20.

The suction pads 30 may have a cylindrical shape, however, the present disclosure is not limited thereto. As another example, the suction pads 30 may have a polygonal shape.

The suction pads 30 may include a rubber material. In the case where the suction pads 30 include the rubber material, an upper surface of the cell units CA may be prevented or substantially prevented from being damaged when the suction pads 30 are suctioned onto the cell units CA.

The suction pads 30 may be connected to a vacuum pump. Accordingly, the suction pads 30 may suction and transfer the cell units CA with a vacuum suction force.

Each of the suction pads 30 may include a suction portion 31, a buffer portion 32 connected onto the suction portion 31, and a connection portion 33 disposed on the buffer portion 32. The connection portion 33 connects the buffer portion 32 to the first surface of the body member BC of the transfer unit TR.

The suction portion 31 may be a portion that is directly in contact with the cell unit CA, and may suction the cell unit CA with the vacuum suction force. A diameter (or a width) of a lower portion of the suction portion 31 may be greater than a diameter (or a width) of an upper portion of the suction portion 31.

The buffer portion 32 may have a bellows shape. As the buffer portion 32 has the bellows shape, the buffer portion 32 may provide a buffering force (e.g., a predetermined buffering force) in a vertical direction (e.g., the third direction DR3 crossing the first and second directions DR1 and DR2).

The reel member may include a first reel RCa for supplying the peeling tape, and a second reel RCb for spooling (e.g., for taking-up) the peeling tape. The first reel RCa and the second reel RCb may be disposed at opposite sides of a line defined on the second surface of the body member BC along the first direction.

According to an embodiment, the transfer unit TR may include a plurality of reel members. In other words, a plurality of the first reels RCa and a plurality of the second reels RCb of the plurality of reel members may be disposed at opposite sides on the second surface of the body member BC to correspond to a plurality of lines defined on the second surface of the body member BC along the first direction. The reel members are arranged along the second direction DR2, and are spaced apart from each other. In this case, in each of the reel members, the first reel RCa may be rotated in synchronization with the second reel RCb that is disposed to face the first reel RCa.

The peeling tape PT may be supplied from the first reel RCa, and may be spooled (e.g., may be taken-up) by the second reel RCb facing the first reel RCa after crossing the first surface of the body member BC. In other words, the peeling tape PT that is wound on the first reel RCa may be supplied to the second reel RCb by the rotation of the first reel RCa and the second reel RCb.

Figure 4:
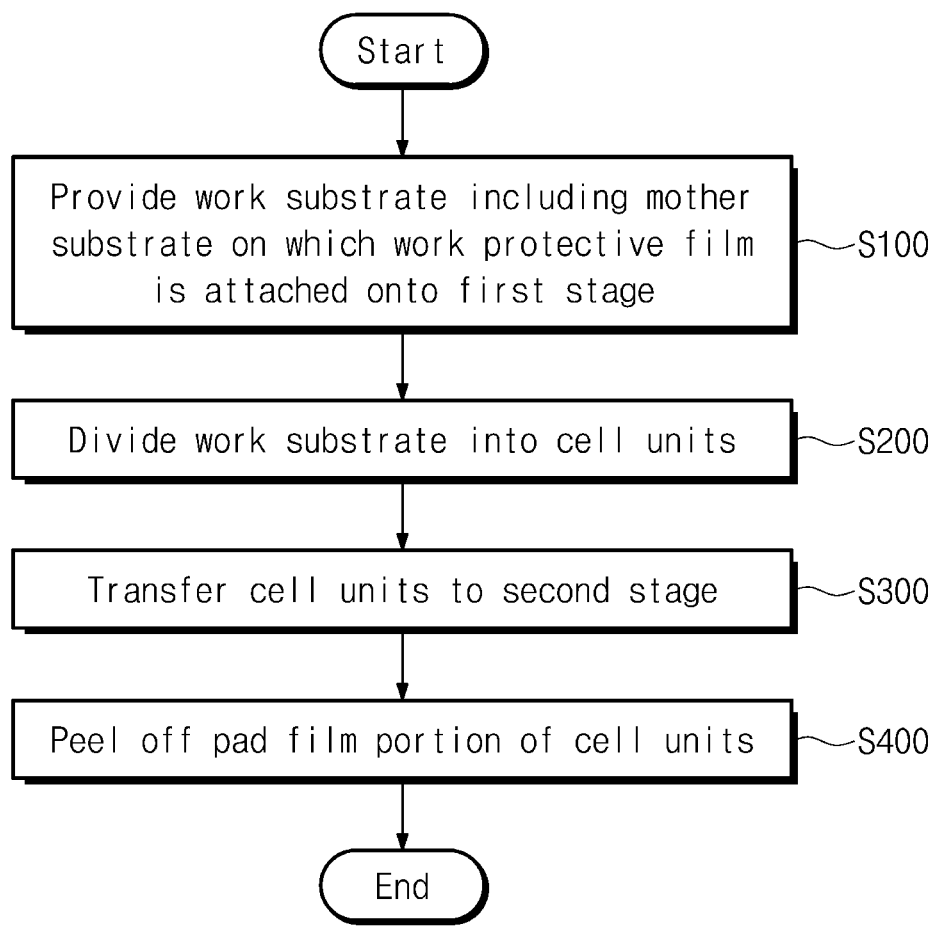
FIG. 4 is a flowchart showing a method of manufacturing a display device according to an embodiment of the present disclosure.
Figure 5:
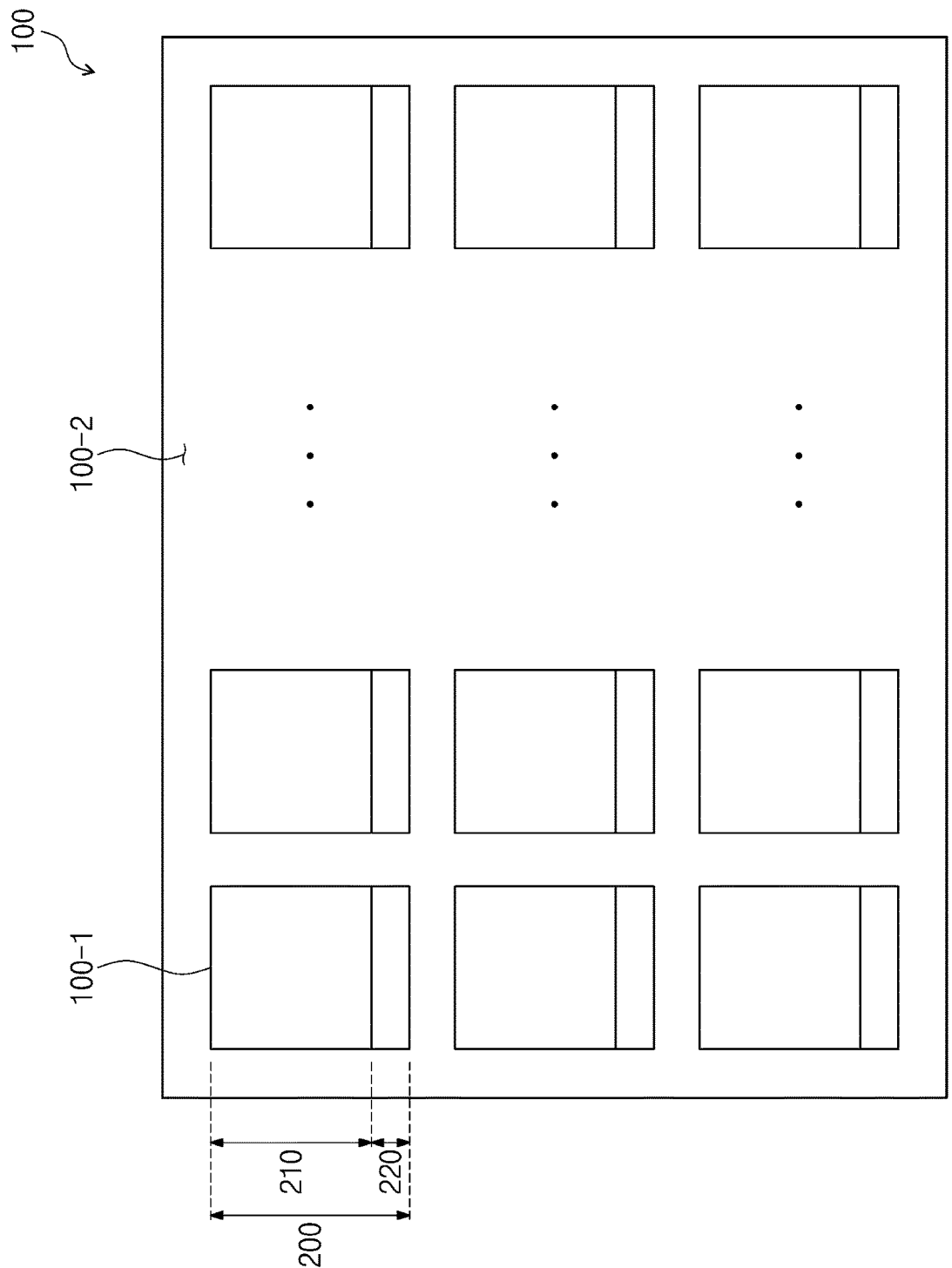
FIG. 5 is a view showing a process of providing a mother substrate according to an embodiment of the present disclosure.
Figure 6:
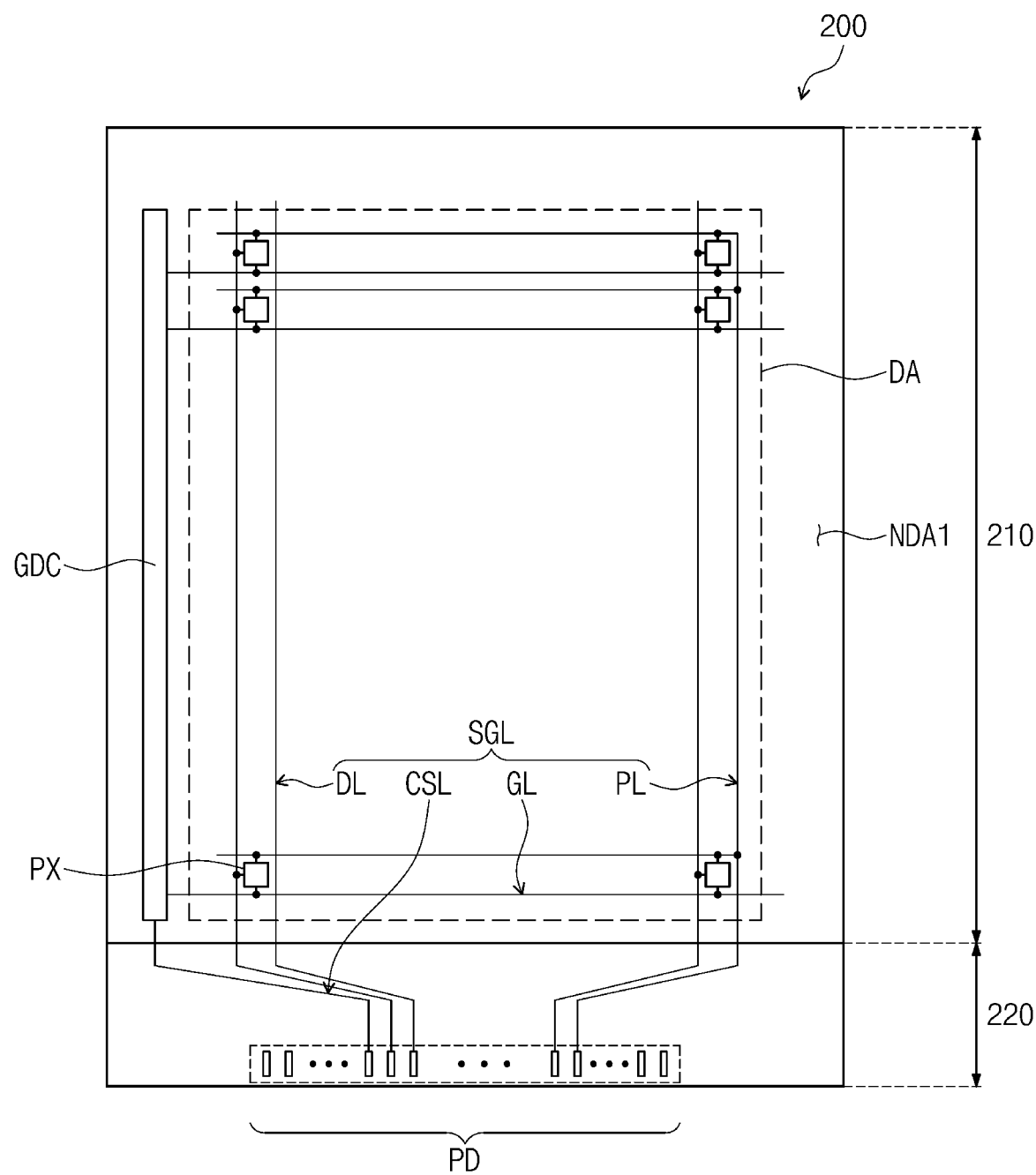
FIG. 6 is a plan view showing a display unit according to an embodiment of the present disclosure.
Figure 7:
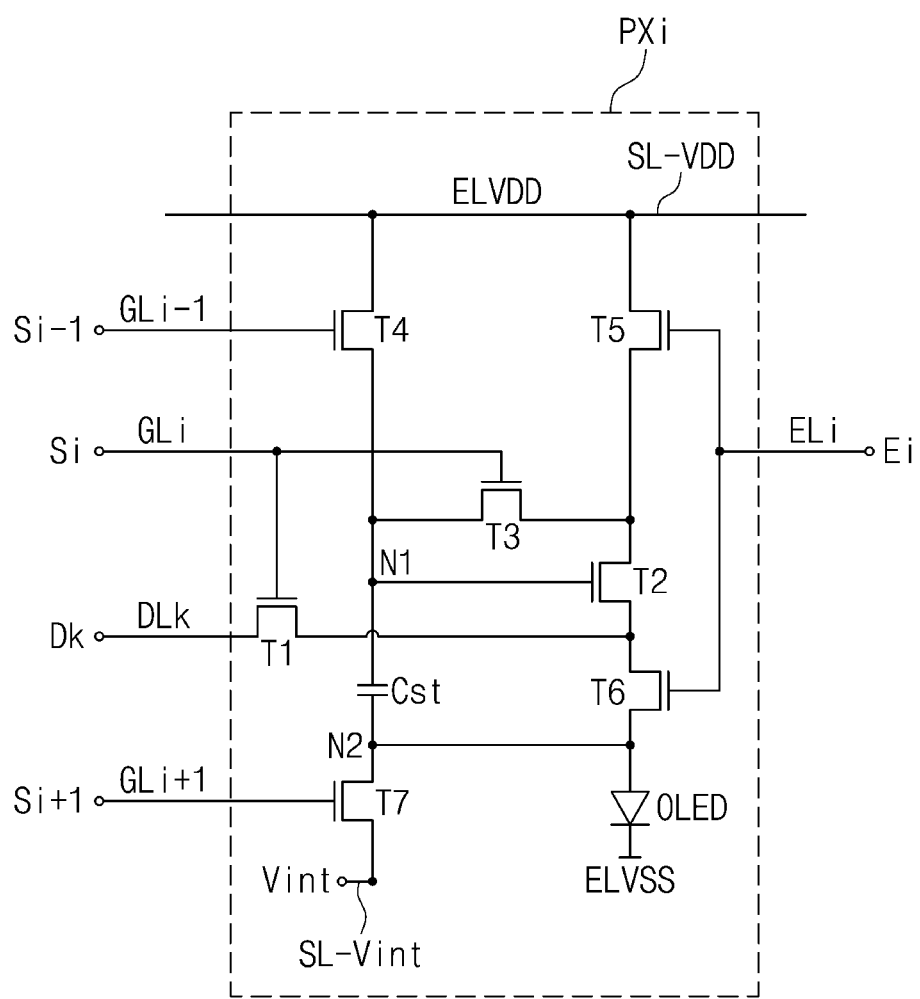
FIG. 7 is an equivalent circuit diagram showing a pixel according to an embodiment of the present disclosure.

FIG. 4 is a flowchart schematically showing a method of manufacturing a display device according to an embodiment of the present disclosure. FIG. 5 is a view showing a process of providing a mother substrate 100 according to an embodiment of the present disclosure. FIG. 6 is a plan view showing a display unit (e.g., a display or a display device) 200 according to an embodiment of the present disclosure. FIG. 7 is an equivalent circuit diagram showing a pixel PXi according to an embodiment of the present disclosure.

Referring to FIG. 4, the manufacturing method of the display device includes providing a work substrate including a mother substrate to which a work protective film is attached onto a first stage (S100), dividing the work substrate into cell units (e.g., cells or cell areas) (S200), transferring the cell units to the second stage (S300), and peeling off the pad film portion of the cell units (S400).

The process of providing the mother substrate 100 including a plurality of display units (e.g., displays or display devices) 200 will be described in more detail with reference to FIGS. 5 to 7. As shown in FIG. 5, a large-area mother substrate 100 may be prepared.

Referring to FIG. 5, the display units 200 may be formed on the mother substrate 100. In more detail, the mother substrate 100 may be a substrate having a suitable size at (e.g., in or on) which the display units 200 may be formed. The mother substrate 100 may be formed of a glass material, or a plastic material having flexibility. For example, the mother substrate 100 may include the plastic material, such as polyimide, but the present disclosure is not limited thereto.

The mother substrate 100 may include active areas 100-1 in which a plurality of display areas are defined, and a non-active area 100-2 corresponding to a portion other than (e.g., except) the active areas 100-1. The active areas 100-1 of the mother substrate 100 may be areas at (e.g., in or on) which the display units 200 are formed after completing some processes, for example, such as depositing, patterning, forming a thin film layer, and etching, and the display units 200 may be concurrently (e.g., simultaneously or substantially simultaneously) formed with each other through the same or substantially the same processes.

Each of the display units 200 may include a display area 210, and a pad area 220. The display units 200 may be arranged on the mother substrate 100, and may be spaced apart from each other.

Hereinafter, one display unit 200 will be described in more detail with reference to FIGS. 6 and 7. FIG. 6 shows an arrangement of a plurality of lines SGL and a plurality of pixels PX included in the display unit 200 when viewed in a plane (e.g., in a plan view or a view from a direction that is perpendicular to or substantially perpendicular to the top surface of the relevant element or layer, for example, such as the top surface of the display unit 200).

Referring to FIG. 6, the display area 210 of the display unit 200 may include a pixel area DA, and a peripheral area NDA1 when viewed in a plane (e.g., in a plan view). In the present embodiment, the peripheral area NDA1 may be defined along an edge of the pixel area DA. In other words, the peripheral area NDA1 may at least partially surround (e.g., around a periphery of) the pixel area DA.

The display unit 200 may include a driving circuit GDC, the plurality of lines SGL, a plurality of signal pads PD, and the plurality of pixels PX. The pixels PX may be arranged at (e.g., in or on) the pixel area DA. Each of the pixels PX may include an organic light emitting diode OLED, and a pixel driving circuit connected to the organic light emitting diode OLED. The driving circuit GDC, the lines SGL, and the pixel driving circuit may be included at (e.g., in or on) a circuit element layer CL (e.g., refer to FIG. 9), which will be described in more detail below.

The driving circuit GDC may include a scan driving circuit. The scan driving circuit may generate a plurality of scan signals, and may sequentially output the scan signals to a plurality of scan lines GL. The scan driving circuit may further output another control signal to the pixel driving circuits of the pixels PX.

The scan driving circuit may include a plurality of thin film transistors formed through the same or substantially the same process as that of the pixel driving circuits of the pixels PX, for example, such as a low temperature polycrystalline silicon (LTPS) process or a low temperature polycrystalline oxide (LTPO) process.

The lines SGL may include the scan lines GL, data lines DL, a power line PL, and a control signal line CSL. Each of the scan lines GL may be connected to corresponding ones of the pixels PX from among the pixels PX, and each of the data lines DL may be connected to corresponding ones of the pixels PX from among the pixels PX. The power line PL may be connected to the pixels PX. The control signal line CSL may apply control signals to the scan driving circuit.

The lines SGL may overlap with the pixel area DA, the peripheral area NDA1, and a non-display area NDA2 (e.g., see FIG. 9) corresponding to the pad area 220. Each of the signal pads PD may be connected to a corresponding line from among the lines SGL.

A line part may substantially constitute most of the lines SGL, and may be connected to the pixel PX. The line part may be connected to transistors of the pixel PX. The line part may have a single-layer structure or a multi-layered structure, and the line part may be provided in an integral single body, or may include two or more parts. The two or more parts may be disposed at (e.g., in or on) different layers from each other, and may be connected to each other via a contact hole defined through an insulating layer disposed between the two or more parts.

FIG. 7 shows an i-th pixel PXi from among the pixels PX connected to a k-th data line DLk from among the data lines DL, where i and k are natural numbers. The i-th pixel PXi is activated in response to an i-th scan signal Si applied to an i-th scan line GLi.

The i-th pixel PXi may include the pixel driving circuit that controls the organic light emitting diode OLED. The pixel driving circuit may include seven thin film transistors T1 to T7, and one capacitor Cst. However, the pixel driving circuit including the seven thin film transistors T1 to T7 and the one capacitor Cst is provided as one example, and the pixel driving circuit may be variously modified, for example, to include any suitable number of transistors and any suitable number of capacitors.

A driving transistor may control a driving current supplied to the organic light emitting diode OLED. For example, a second transistor T2 may be the driving transistor. An output electrode of the second transistor T2 may be electrically connected to the organic light emitting diode OLED. The output electrode of the second transistor T2 may be connected to the organic light emitting diode OLED via a sixth transistor T6.

The sixth transistor T6 is connected between an output electrode of a first transistor T1 and an anode electrode of the organic light emitting diode OLED. A control electrode of the sixth transistor T6 may be connected to an i-th light emitting control line ELi.

A control electrode of a control transistor may receive a control signal. The control signal applied to the i-th pixel PXi may include an (i−1)th scan signal Si−1, the i-th scan signal Si, an (i+1)th scan signal Si+1, a data signal Dk, and an i-th light emitting control signal Ei. According to an embodiment, the control transistor may include the first transistor T1 and the third to seventh transistors T3 to T7.

The first transistor T1 may include a sensing electrode connected to the k-th data line DLk, a control electrode connected to the i-th scan line GLi, and the output electrode connected to the output electrode of the second transistor T2. The first transistor T1 may be turned on in response to the scan signal Si (hereinafter, referred to as the i-th scan signal) applied to the i-th scan line GLi, and may apply the data signal Dk applied to the k-th data line DLk to the storage capacitor Cst.

Figure 9:
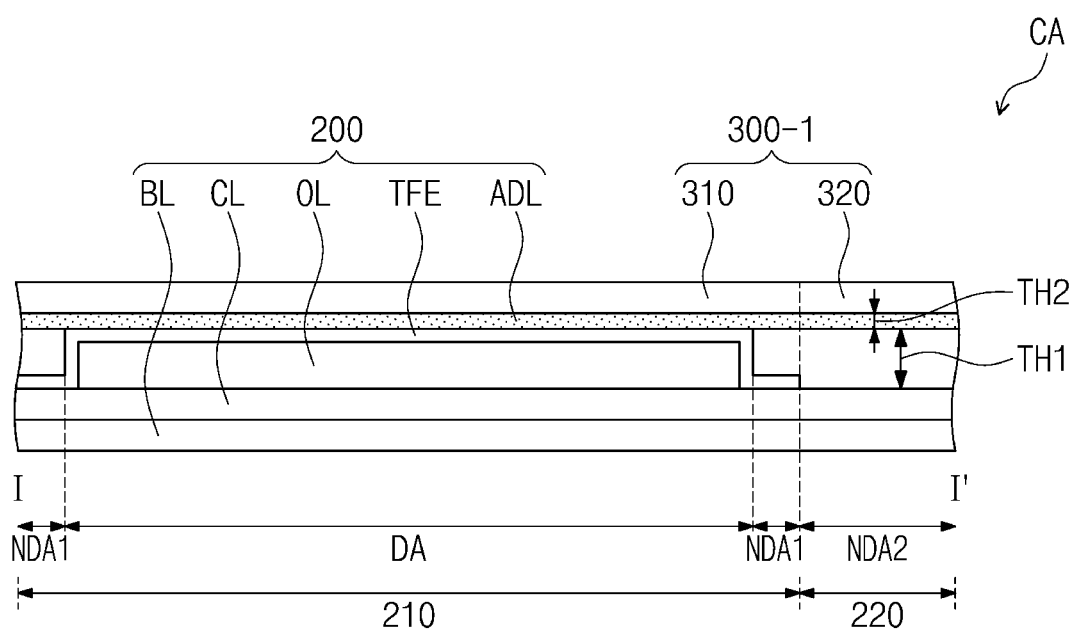
FIG. 9 is a cross-sectional view taken along the line I-I' of FIG. 8, and shows a cell unit according to an embodiment of the present disclosure.

FIG. 8 is a view showing the work substrate 110 including the mother substrate 100 to which the work protective film 300 is attached according to an embodiment of the present disclosure, and FIG. 9 is a cross-sectional view taken along the line I-I' of FIG. 8, and shows the cell unit CA according to an embodiment of the present disclosure. As shown in FIG. 8, after the mother substrate 100 is formed, the work protective film 300 may be attached to the mother substrate 100 to provide the work substrate 110 (S100).

The work protective film 300 may be attached to an upper portion (e.g., an upper surface) of the mother substrate 100 at (e.g., in or on) which the display units 200 are formed. Accordingly, the work substrate 110 including the mother substrate 100 to which the work protective film 300 is attached may be formed. In some embodiments, the work protective film 300 may be attached to a lower portion (e.g., a lower surface) of the mother substrate 100.

In FIG. 8, the work protective film 300 is shown to have a size that is smaller than that of the mother substrate 100, however, the present disclosure is not limited thereto. For example, the size of the work protective film 300 is not particularly limited, as long as the work protective film 300 may protect the mother substrate 100. For example, the work protective film 300 may have the same or substantially the same size as that of the mother substrate 100.

The work protective film 300 may prevent or substantially prevent external moisture and/or foreign substances from entering the display units 200 (e.g., refer to FIG. 5), and may prevent or reduce cracks from occurring during the manufacturing processes of the display device. The work protective film 300 may include a flexible material, for example, such as a polymer resin.

The work protective film 300 may include a protective film unit (e.g., a protective film portion) 300-1, and a non-active film area 300-C, which may correspond to the active area 100-1 and the non-active area 100-2 (e.g., refer to FIG. 5), respectively.

The protective film unit 300-1 may include a display film portion 310, and a pad film portion 320, which may correspond to the display area 210 and the pad area 220, respectively, of the display unit 200 (e.g., refer to FIG. 5). According to one or more embodiments of the present disclosure, the pad film portion 320 may be removed in the peeling-off operation.

Referring to FIG. 9, one cell unit (e.g., one cell or one cell area) CA may include the display unit 200, and the protective film unit 300-1 disposed on the display unit 200. In some embodiments, a second protective film unit (e.g., a second protective film portion) may be further disposed under (e.g., underneath) the display unit 200, and a second adhesive layer may be further disposed between the second protective film unit and the display unit 200.

The protective film unit 300-1 may be connected to (e.g., may be coupled with) an uppermost layer of the display unit 200 by an adhesive layer ADL. The uppermost layer of the display unit 200 may have a step difference in some areas thereof.

An upper surface of the adhesive layer ADL, which is attached to the protective film unit 300-1, may have an adhesion that is stronger than an adhesion of a lower surface of the adhesive layer ADL, which is attached to a thin film encapsulation layer TFE. Thus, the adhesive layer ALD may be easily removed from the display unit 200 during the peeling-off operation.

An empty space may be defined between the adhesive layer ADL and a surface of the pad area 220, and the empty space may have a first thickness TH1. Because a display element layer OL may not be deposited at (e.g., in or on) the pad area 220, the step difference may be generated at (e.g., in or on) the pad area 220, such that the empty space having the first thickness TH1 is formed at (e.g., in or on) the pad area 220. At (e.g., in or on) the pad area 220, the adhesive layer ADL and the protective film unit 300-1 may be stacked after patterning the circuit element layer CL to form the lines SGL (e.g., refer to FIG. 6).

The adhesive layer ADL may have a second thickness TH2 defined by a distance (e.g., a minimum distance) from the upper surface of the adhesive layer ADL that is attached to the protective film unit 300-1 to the lower surface of the adhesive layer ADL that is attached to the thin film encapsulation layer TFE.

The second thickness TH2 of the adhesive layer ADL may be within a range from about 50 μm to about 75 μm, and the first thickness TH1 may be within a range from about 30 nm to about 70 nm, such that a flat or substantially flat surface shape of the work protective film 300 may not be affected by the empty space. For convenience of illustration, the first thickness TH1 is shown to be exaggerated when compared with the second thickness TH2.

The cell unit CA may include a base layer BL, the circuit element layer CL, the display element layer OL, the thin film encapsulation layer TFE, the adhesive layer ADL, and the protective film unit 300-1. The circuit element layer CL, the display element layer OL, the thin film encapsulation layer TFE, the adhesive layer ADL, and the protective film unit 300-1 may be disposed on the base layer BL. In some embodiments, the cell unit CA may further include various suitable functional layers, for example, such as an anti-reflective layer, a refractive index control layer, and/or the like.

The base layer BL may include a synthetic resin film. A synthetic resin layer may be formed on the mother substrate 100 (e.g., refer to FIG. 5) used to manufacture the display unit 200. Then, a conductive layer and an insulating layer may be formed on the synthetic resin layer. The synthetic resin layer may be a polyimide-based resin layer, however, the material for the synthetic resin layer is not particularly limited. In addition, the base layer BL may include a glass substrate, a metal substrate, or an organic/inorganic composite substrate.

The circuit element layer CL may include at least one intermediate insulating layer, and a circuit element. The intermediate insulating layer may include at least one intermediate inorganic layer, and at least one intermediate organic layer. The circuit element may include the driving circuit GDC, the lines SGL, and the pixel driving circuit.

The circuit element layer CL may be formed by forming an insulating layer and a conductive layer using coating and depositing processes, and patterning the conductive layer and/or a semiconductor layer using a photolithography process.

The display element layer OL may include a light emitting element. The display element layer OL may include the organic light emitting diodes. The display element layer OL may further include an organic layer, for example, such as a pixel definition layer.

The thin film encapsulation layer TFE may encapsulate the display element layer OL. The thin film encapsulation layer TFE may include at least one insulating layer. According to an embodiment, the thin film encapsulation layer TFE may include at least one inorganic layer (hereinafter, referred to as an encapsulation inorganic layer). According to an embodiment, the thin film encapsulation layer TFE may include at least one organic layer (hereinafter, referred to as an encapsulation organic layer), and at least one encapsulation inorganic layer.

The encapsulation inorganic layer may protect the display element layer OL from moisture and/or oxygen, and the encapsulation organic layer may protect the display element layer OL from a foreign substance, for example, such as dust particles. The encapsulation inorganic layer may include a silicon nitride layer, a silicon oxynitride layer, a silicon oxide layer, a titanium oxide layer, or an aluminum oxide layer, but the present disclosure is not limited thereto. The encapsulation organic layer may include an acrylic-based organic layer, but the present disclosure is not limited thereto.

Figure 10:
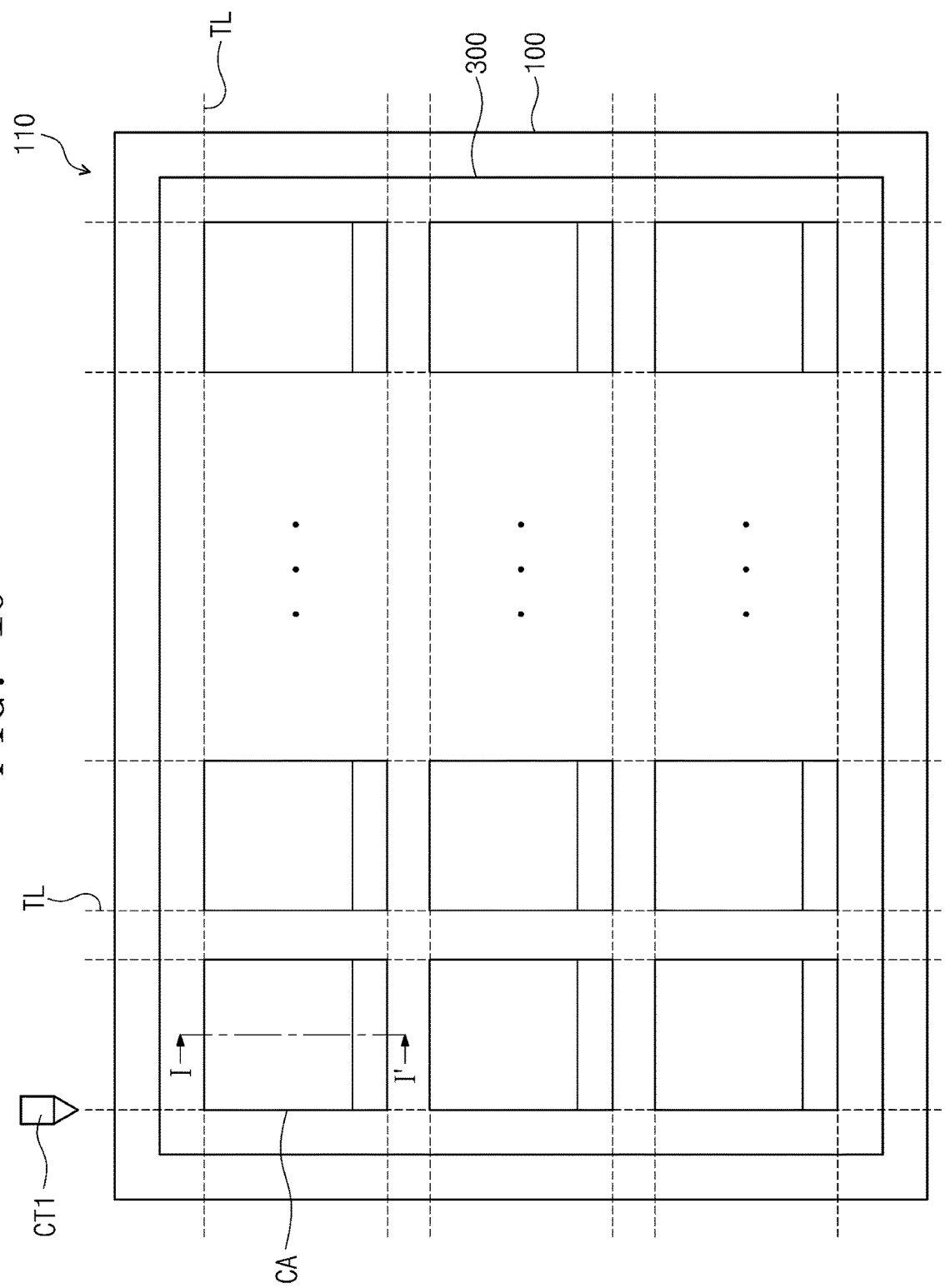
FIG. 10 is a view showing a process of separating cell units by cutting along a first cutting line according to an embodiment of the present disclosure.

FIG. 10 is a view showing a process of separating cell units CA according to an embodiment of the present disclosure (S200).

Referring to FIG. 10, the work substrate 110 may include the cell units CA. In other words, the cell units CA may be defined as the display unit 200 (e.g., refer to FIG. 5) to which the protective film unit 300-1 (e.g., refer to FIG. 8) is attached.

In the separating of the cell units CA (S200), the cell units CA of the work substrate 110 may be cut and separated into a plurality of individual cell units CA by a first device CT1. The first device CT1 may cut the cell units CA while moving in the first direction DR1 and the second direction DR2 along a first cutting line TL formed at an edge of the cell units CA. Accordingly, the cell units CA formed on the work substrate 110 may be separated into the plurality of individual cell units CA. As an example, the first device CT1 may irradiate a laser beam to cut the work substrate 110. For example, the first device CT1 may include a laser oscillation unit (e.g., a laser oscillator), a laser optical unit (e.g., a laser optic), and a laser condensing unit (e.g., a laser condenser).

Figure 11:
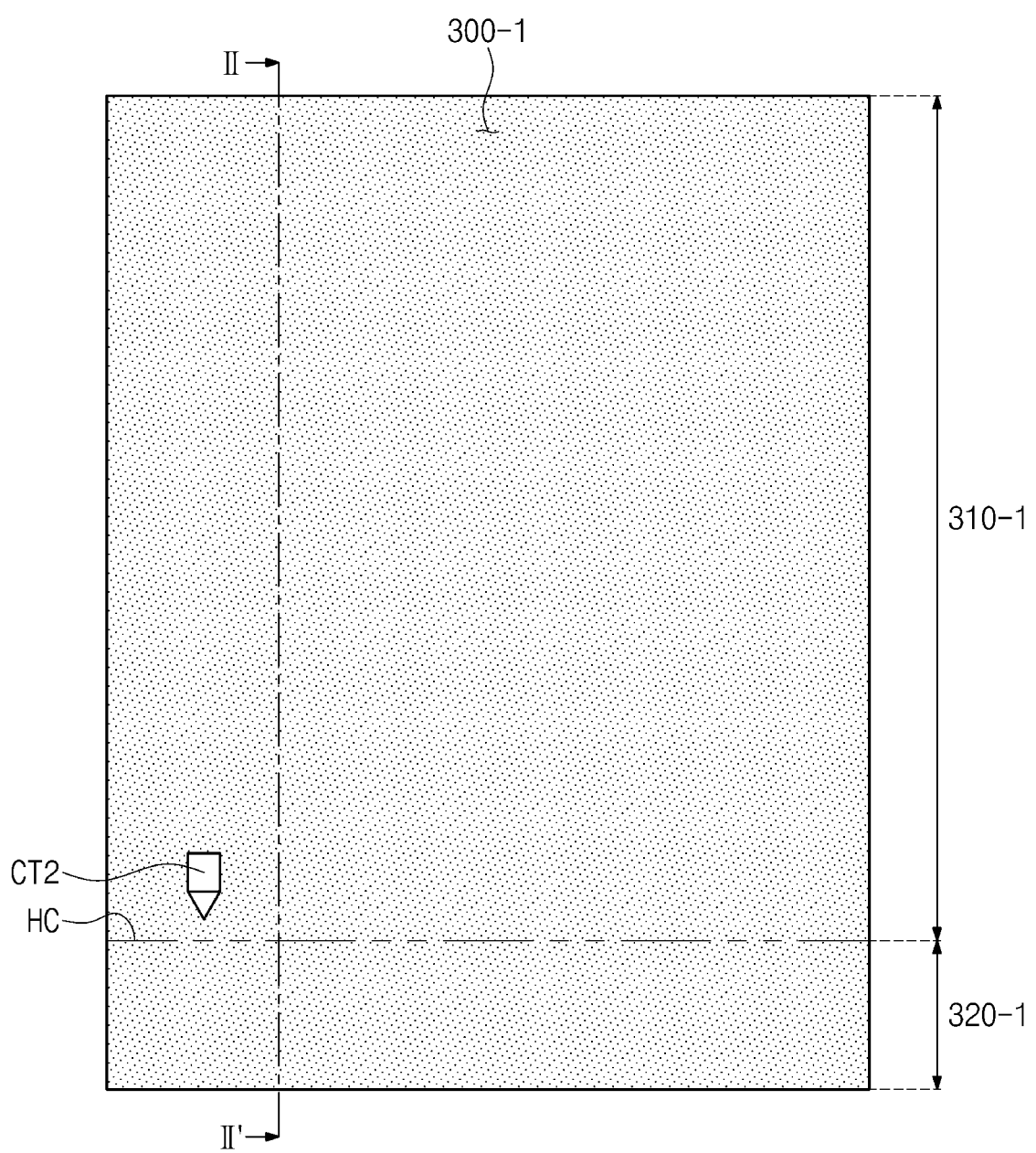
FIG. 11 is a plan view showing a cell unit in which a second cutting line is defined according to an embodiment of the present disclosure.

FIG. 11 is a plan view showing a cell unit (e.g., a cell or a cell area) in which a second cutting line HC is defined according to an embodiment of the present disclosure The second cutting line HC may be formed along a boundary between a display film portion 310-1 and a pad film portion 320-1. The second cutting line HC may be formed by using a second device CT2. The second device CT2 may use the same or substantially the same equipment as that of the first device CT1. In this case, a cutting depth of a cut surface may be adjusted by adjusting an intensity of the laser beam. The second cutting line HC may serve as a reference line of an area to be peeled off in the subsequent peeling-off process.

Figure 12:
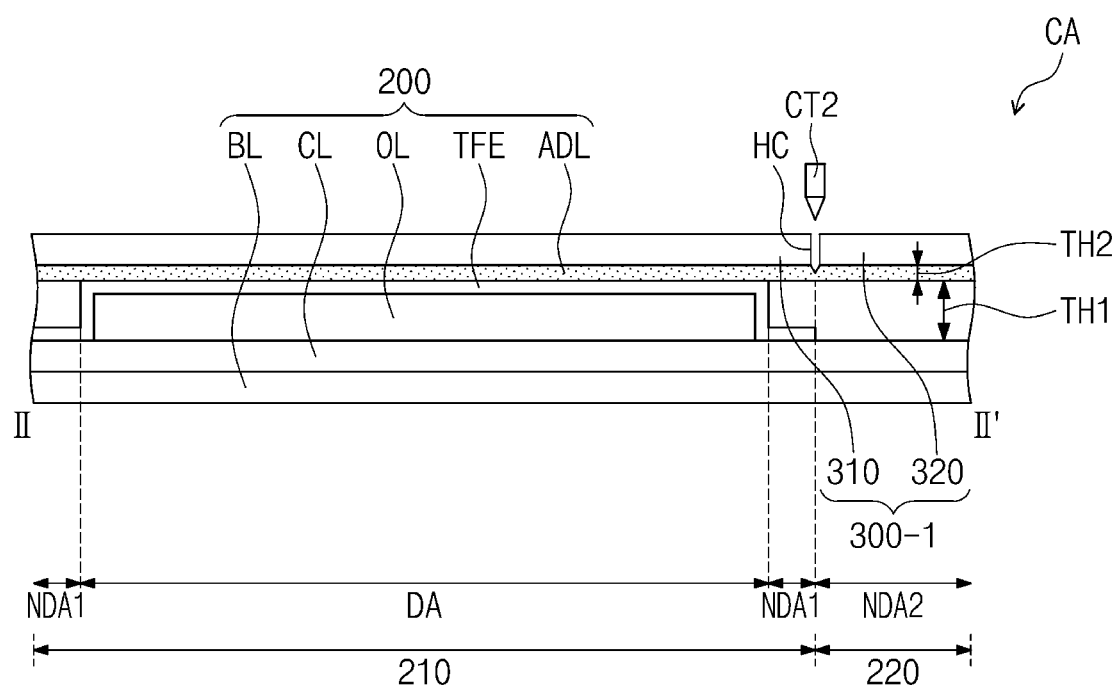
FIG. 12 is a cross-sectional view showing a cell unit in which a second cutting line is defined according to an embodiment of the present disclosure.

FIG. 12 is a cross-sectional view showing the cell unit CA in which the second cutting line HC is defined according to an embodiment of the present disclosure. For example, FIG. 12 may be a cross-sectional view taken along the line II-II' of FIG. 11. Hereinafter, the second cutting line HC will be described in more detail with reference to FIG. 12.

The second cutting line HC may be defined by removing (e.g., by completely removing) a portion of the protective film unit 300-1 in a thickness direction of the protective film unit 300-1, such that a portion of the adhesive layer ADL disposed between the protective film unit 300-1 and the uppermost layer of the display unit 200 is exposed to the outside. A thickness of the adhesive layer ADL remaining in an area in which the second cutting line HC is defined may be within a range from about 25 μm to about 40 μm. In a case where the thickness of the adhesive layer ADL remaining in the area after the second cutting line HC is defined is smaller than about 25 μm, the protective film unit 300-1 may be detached before the peeling-off process, and as a result, moisture of foreign substances may enter. In a case where the thickness of the adhesive layer ADL remaining in the area after the second cutting line HC is defined is greater than about 40 μm, defects may occur in the peeling-off process due to the adhesion (e.g., due to the adhesion strength of the adhesive layer ADL).

In some embodiments, a process of weakening an adhesion of the edges of a peeling target may be performed before proceeding to the peeling-off operation to lower a probability of failure of the peeling-off operation. As an example, the peeling-off operation may be performed after hitting the edges of the peeling target to weaken the adhesion of the adhesive layer ADL.

Figure 13:
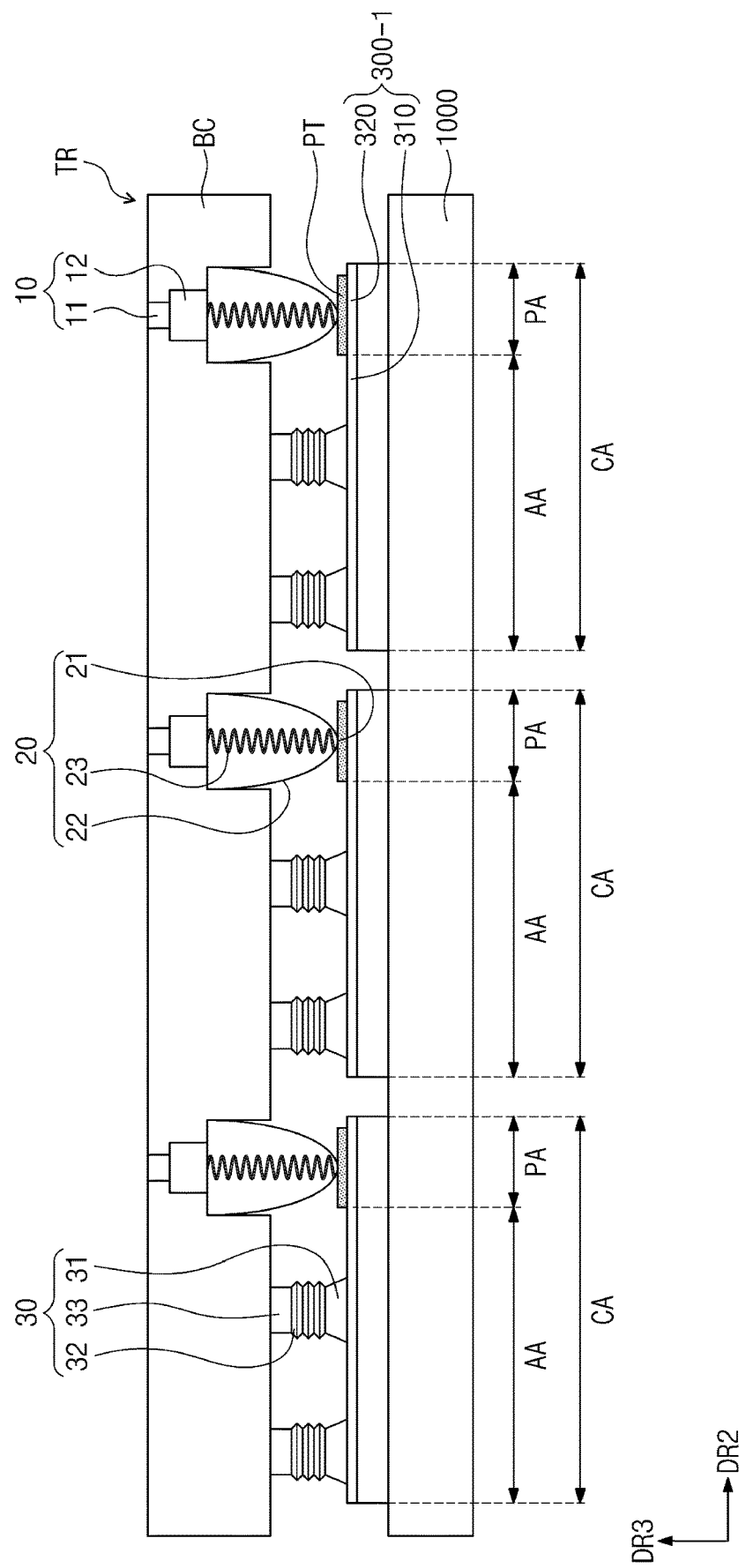
FIGS. 13-14 are side views showing an operation of a manufacturing apparatus of a display device according to an embodiment of the present disclosure.
Figure 14:
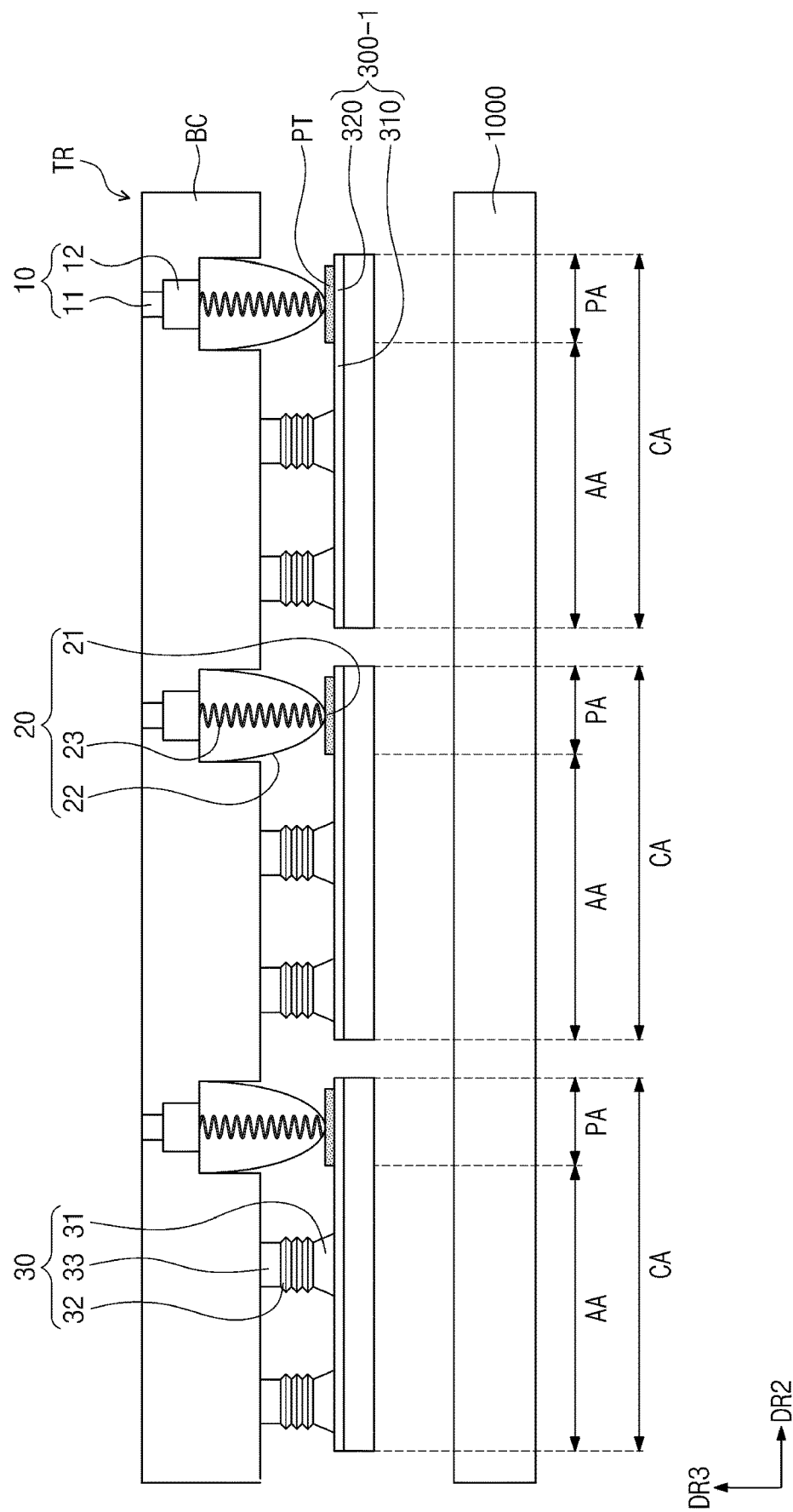

FIGS. 13 and 14 are side views showing an operation of the manufacturing apparatus of the display device according to an embodiment of the present disclosure. Hereinafter, in FIGS. 13 and 14, redundant description of the same or substantially the same elements and layers as those described above with reference to FIGS. 1 to 3 may not be repeated.

Referring to FIG. 13, the transfer unit TR may be disposed on the first stage 1000 including the cell units CA according to a driving of the driver 400 (e.g., refer to FIG. 1). When the transfer unit TR descends, the suction pads 30 may be in contact with the display film portion 310 of the cell units CA. Then, the suction pads 30 may be driven to have a vacuum suction force by a vacuum pump connected to the suction pads 30. Accordingly, the cell units CA may be adsorbed (or suctioned) onto the suction pads 30 by the vacuum suction force.

However, the driving of the suction pads 30 are not limited thereto. As another example, the suction pads 30 may be driven to have the vacuum suction force before being in contact with the cell units CA, and the cell units CA may be adsorbed (or suctioned) onto the suction pads 30.

According to an embodiment, at least two suction pads 30 may be disposed on one cell unit CA. While FIGS. 13 and 14 show a structure in which two suction pads 30 are disposed on the one cell unit CA, the present disclosure is not limited thereto.

Referring to FIG. 14, the cell units CA that are adsorbed onto the suction pads 30 may be lifted from the first stage 1000 as the transfer unit TR ascends. Then, the cell units CA may be transferred to and disposed on the second stage 2000 (e.g., refer to FIG. 1).

When the cell units CA are adsorbed onto the suction pads 30, the pins 20 may descend vertically to attach the peeling tape PT to the pad film portion 320 of the cell units CA. For example, the transferring of the cell units CA onto the second stage 2000 (e.g., refer to FIG. 1) and the attaching of the peeling tape PT to the pad film portion 320 of the cell units CA may be concurrently (e.g., simultaneously or substantially simultaneously) performed, but the present disclosure is not limited thereto. In other words, the pins 20 may descend vertically after the cell units CA are transferred onto the second stage 2000 (e.g., refer to FIG. 1) to attach the peeling tape PT to the pad film portion 320 of the cell units CA.

In the case where the peeling tape PT is attached to the pad film portion 320 of the cell units CA in the process of transferring the cell units CA onto the second stage 2000 (e.g., refer to FIG. 1), the pad film portion 320 of the cell units CA may be peeled off while being transferred onto the second stage 2000, and thus, a processing time thereof may be shortened.

Hereinafter, the peeling-off of the pad film portion 320 of the cell units CA (S400) according to an embodiment will be described in more detail with reference to FIGS. 15 to 19.

Figure 15:
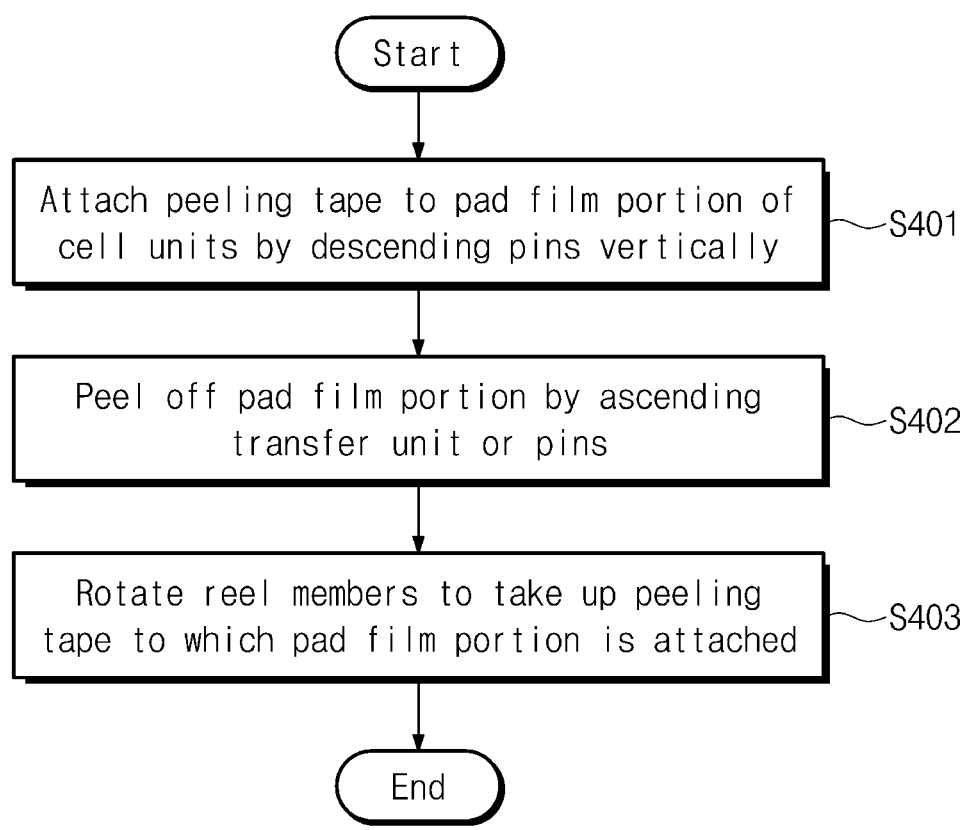
FIG. 15 is a flowchart showing a method of peeling off a pad film portion of cell units according to an embodiment of the present disclosure.
Figure 16:
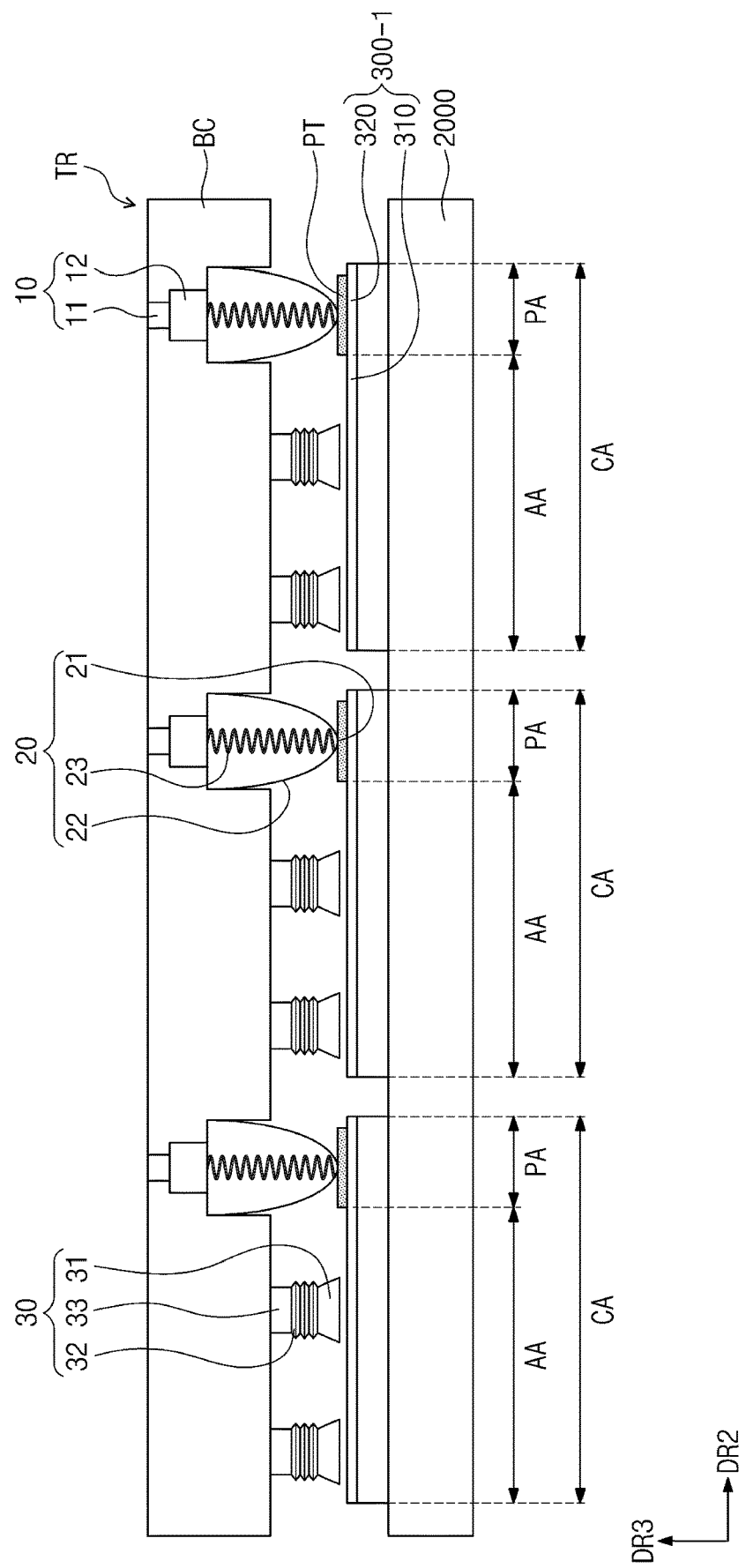
FIG. 16 is a side view showing an operation of a manufacturing apparatus of a display device according to an embodiment of the present disclosure.
Figure 17:
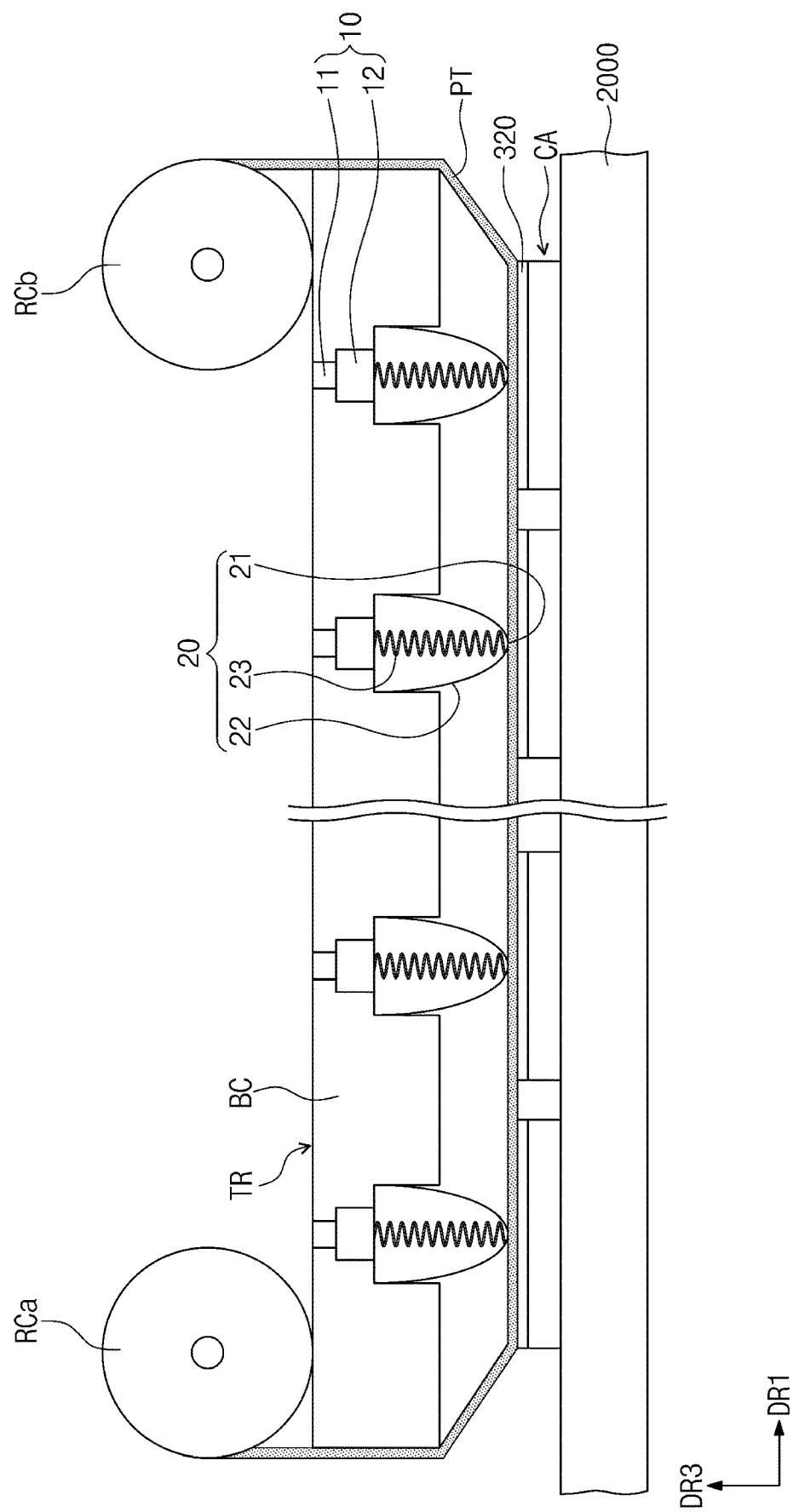
FIGS. 17-19 are front views showing an operation of a manufacturing apparatus of a display device according to an embodiment of the present disclosure.
Figure 18:
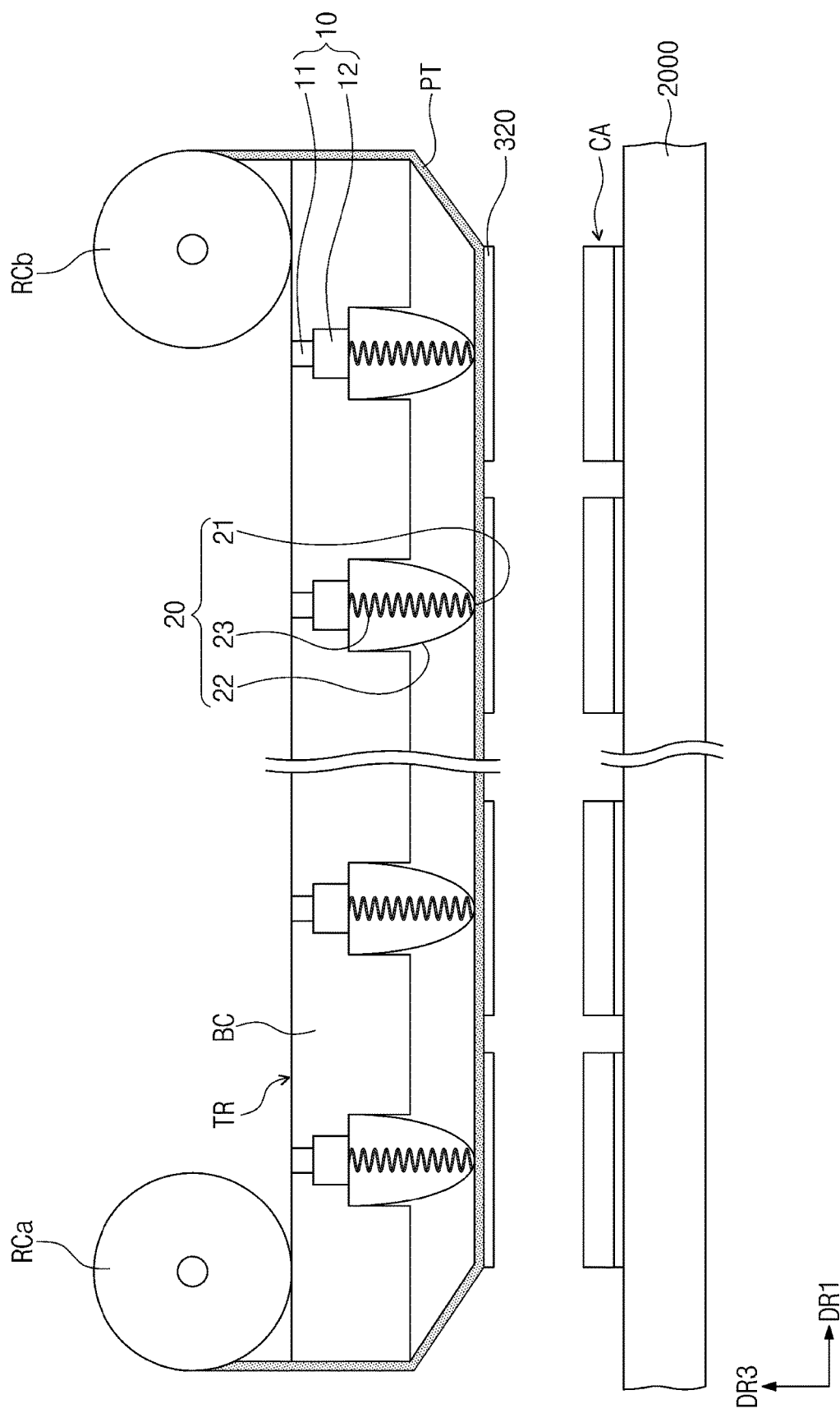
Figure 19:
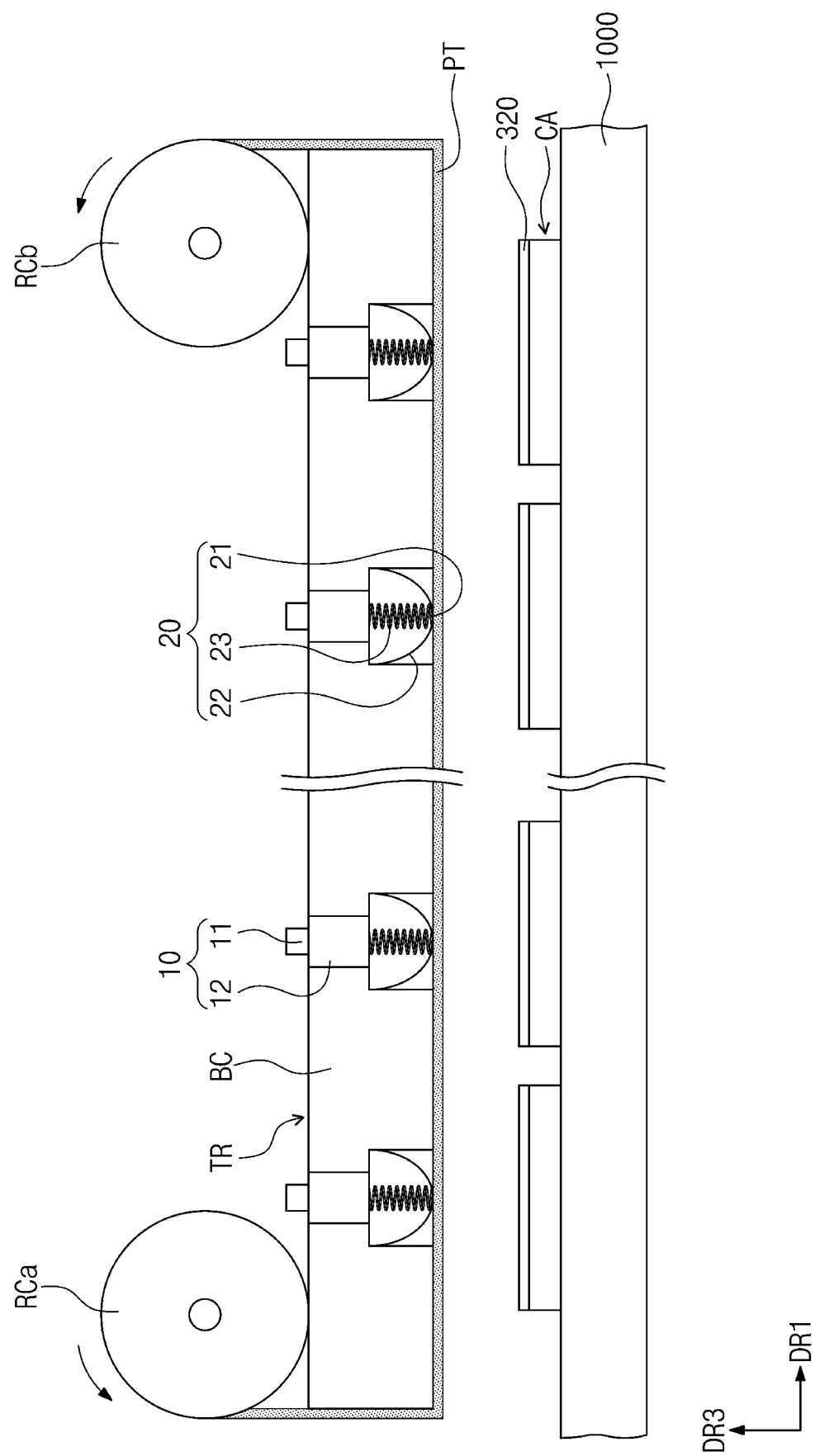

FIG. 15 is a flowchart showing a method of peeling off the pad film portion 320 of the cell units CA according to an embodiment of the present disclosure. FIG. 16 is a side view showing an operation of the manufacturing apparatus of the display device according to an embodiment of the present disclosure. FIGS. 17 to 19 are front views showing an operation of the manufacturing apparatus of the display device according to an embodiment of the present disclosure. In FIGS. 15 to 19, redundant description of the same or substantially the same elements and layers as those described above with reference to FIGS. 1 to 3 may not be repeated.

FIG. 16 is a side view showing the driving of the transfer unit TR on the second stage 2000 in the beginning of the peeling off operation of the pad film portion 320 of the cell units CA when viewed in the first direction DR1, and FIGS. 17 to 19 are front views showing the driving of the transfer unit TR on the second stage 2000 in the peeling off operation of the pad film portion 320 of the cell units CA when viewed in the second direction DR2.

Referring to FIG. 15, the peeling off operation (S400) of the pad film portion 320 of the cell units CA may include descending the pins vertically so that the peeling tape is attached to the pad film portion of the cell units (S401), ascending the transfer unit or the pins so that the pad film portion of the cell units is peeled off (S402), and rotating the reel members so that the peeling tape attached to the peeled-off pad film portion of the cell units (S403) is taken-up (e.g., is spooled).

Referring to FIG. 16, the transfer unit TR may transfer the cell units CA onto the second stage 2000 by the driving of the driver 400 (e.g., see FIG. 1).

According to an embodiment, the transferring of the cell units CA onto the second stage 2000 may further include adsorbing (or suctioning) the display film portion 310 of the cell units CA by the suction pads 30 on the first stage 1000 (e.g., refer to FIG. 13), and separating the cell units CA from the suction pads 30 to place the cell units CA on the second stage 2000.

Referring to FIGS. 16 and 17, after the cell units CA are disposed on the second stage 2000, the pins 20 may descend vertically to attach the peeling tape PT to the pad film portion 320 of the cell units CA.

Referring to FIGS. 17 and 18, after the peeling tape PT is attached to the pad film portion 320 of the cell units CA, the transfer unit TR may ascend to peel off the pad film portions 320 of the cell units CA that are attached to the peeling tape PT.

FIG. 18 shows the peeling-off operation of the pad film portion 320 of the cell units CA by the ascending of the transfer unit TR, however, the peeling-off operation of the pad film portion 320 is not limited thereto. According to an embodiment, the pins 20 may vertically move up to peel off the pad film portion 320 of the cell units CA before the transfer unit TR ascends, or the transfer unit TR may ascend after the pad film portion 320 of the cell units CA is peeled off.

According to an embodiment, after the peeling-off operation of the pad film portion 320 of the cell units CA, the first reel RCa and the second reel RCb may rotate to take up (e.g., to spool) the peeling tape PT to which the pad film portions 320 of the cell units CA are attached.

Referring to FIGS. 18 and 19, after the peeling tape PT attached to the pad film portion 320 of the cell units CA is taken up due to the rotation of the first reel RCa and the second reel RCb, the transfer unit TR may move to the first stage 1000 again, and may repeatedly perform the above-described method.

According to one or more embodiments of the present disclosure, the peeling-off operation may be performed in a unit of the mother substrate. In other words, the peeling-off operation may be performed for a plurality of the cell units CA concurrently, rather than one of the cell units CA at a time. Accordingly, the reliability of the display device may be improved, because it may be possible to prevent or reduce defects caused by errors in seating a cell, and variations in the width of a pad portion, which may occur in a comparative peeling method that is performed in a unit of the cell.

In addition, as the peeling-off process is performed in the unit of the mother substrate, the manufacturing process may be simplified, and thus, the manufacturing time may be reduced. In a comparative method, the peeling-off process is performed in the unit of cell to peel off a protective film attached to a pad area of a display device. As a result, it may take a long time to peel the protective film, which may lead to deterioration in the productivity and the efficiency thereof. However, according to one or more embodiments of the present disclosure, the mother substrate may be formed regardless of the size and/or number of the cells, and the protective film that is attached to each of the cell units may be concurrently (e.g., simultaneously or substantially simultaneously) peeled off in the unit of the mother substrate. Thus, the process time may be reduced, and the productivity and efficiency of the manufacturing method of the display device may be improved.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. An apparatus for manufacturing a display device, comprising:
 a first stage comprising a plurality of cell units defined by dividing a mother substrate and a work protective film attached on the mother substrate, each of the cell units comprising:
  a display unit comprising a display area, and a pad area; and
  a protective film unit attached to the display unit, and comprising a display film portion corresponding to the display area, and a pad film portion corresponding to the pad area;
 a second stage where the pad film portion of the cell units is peeled off; and
 a transfer unit configured to transfer the cell units to the second stage from the first stage, and to peel off the pad film portion, the transfer unit comprising:
  a body member comprising a first surface and a second surface opposite to the first surface;
  a plurality of pins along a first direction on the first surface of the body member;
  a plurality of suction pads on the first surface of the body member along a second direction crossing the first direction; and a reel member on the second surface of the body member, and configured to supply a peeling tape.

2. The apparatus of claim 1, wherein the pins are located along a plurality of lines defined in the first direction, and spaced from each other.

3. The apparatus of claim 1, wherein each of the cell units corresponds to at least one of the pins.

4. The apparatus of claim 1, wherein the reel member comprises a plurality of reel members, and the plurality of reel members are located along the second direction, and spaced from each other.

5. The apparatus of claim 4, wherein each of the plurality of reel members comprises:
   a first reel configured to supply the peeling tape; and
   a second reel facing the first reel, and configured to take up the peeling tape.

6. The apparatus of claim 1, wherein the suction pads are configured to adsorb the display film portion.

7. The apparatus of claim 1, wherein at least two suction pads from among the plurality of suction pads are configured to adsorb one cell unit from among the plurality of cell units.

8. The apparatus of claim 1, wherein each of the suction pads comprises:
   a suction portion configured to adsorb a corresponding cell unit from among the plurality of cell units;
   a buffer portion connected to the suction portion; and
   a connection portion connecting the suction portion and the body member to each other,
   wherein the suction portion and the buffer portion comprise a rubber material.

9. The apparatus of claim 8, wherein the suction portion has a vacuum suction force.

10. The apparatus of claim 1, wherein each of the pins comprises:
    a contact portion in contact with the peeling tape;
    a support portion extending from the contact portion, and located in a hole defined through the body member; and
    a spring in contact with the contact portion, and located in the support portion.

11. The apparatus of claim 1, wherein the pins are configured to concurrently descend or ascend vertically.

12. The apparatus of claim 1, further comprising a driver configured to drive the transfer unit.

13. The apparatus of claim 1, wherein the second stage comprises a fixing member configured to fix the cell units.

14. A method of manufacturing a display device, comprising:
    providing a work substrate on a first stage, the work substrate comprising:
      a mother substrate comprising a plurality of display units, each of the display units comprising a display area, and a pad area; and
      a work protective film attached to the mother substrate, and comprising a display film portion corresponding to the display area, and a pad film portion corresponding to the pad area;
    cutting the work substrate to divide the work substrate into a plurality of cell units, each of the cell units comprising one display unit from among the plurality of display units, and a protective film unit of the work protective film, the protective film unit corresponding to the one display unit;
    transferring the cell units to a second stage using a transfer unit, the transfer unit comprising:
      a body member;
      a plurality of pins along a first direction on a first surface of the body member; and
      a plurality of suction pads on the first surface of the body member along a second direction crossing the first direction;
    attaching a peeling tape to the pad film portion of the cell units by descending the pins vertically; and
    peeling off the pad film portion of the cell units attached to the peeling tape by ascending the transfer unit or the pins.

15. The method of claim 14, wherein the transferring of the cell units to the second stage comprises:
    adsorbing the display film portion of the cell units by the suction pads; and
    separating the cell units from the suction pads on the second stage, and placing the cell units on the second stage.

16. The method of claim 14, further comprising rotating a plurality of reel members to take up the peeling tape after the peeling off of the pad film portion of the cell units, the plurality of reel members being located at sides of a second surface of the body member opposite to the first surface of the body member.

17. The method of claim 16, wherein each of the reel members comprises:
    a first reel configured to supply the peeling tape; and
    a second reel facing the first reel, and configured to take up the peeling tape, and
    wherein the first reel is rotated in synchronization with the second reel taking up of the peeling tape.

18. The method of claim 14, wherein the cutting of the work substrate comprises:
    cutting the work substrate along a first cutting line corresponding to an edge of each of the display units; and
    cutting the work protective film along a second cutting line corresponding to a boundary between the display area and the pad area of a corresponding display unit.

19. The method of claim 14, wherein the second stage comprises a fixing member to fix the cell units.

20. The method of claim 14, wherein the transferring of the cell units to the second stage and the attaching of the peeling tape to the pad film portion of the cell units are concurrently performed.

* * * * *